(12) United States Patent
Thomas et al.

(10) Patent No.: US 10,694,192 B2
(45) Date of Patent: Jun. 23, 2020

(54) HEVC-TILED VIDEO STREAMING

(71) Applicant: Koninklijke KPN N.V., Rotterdam (NL)

(72) Inventors: Emmanuel Thomas, Delft (NL); Ray Van Brandenburg, The Hague (NL)

(73) Assignee: Koninklijke KPN N.V., Rotterdam (NL)

( * ) Notice: Subject to any disclaimer, the term of this patent is extended or adjusted under 35 U.S.C. 154(b) by 161 days.

(21) Appl. No.: 15/318,619

(22) PCT Filed: Jun. 26, 2015

(86) PCT No.: PCT/EP2015/064527
§ 371 (c)(1),
(2) Date: Dec. 13, 2016

(87) PCT Pub. No.: WO2015/197818
PCT Pub. Date: Dec. 30, 2015

(65) Prior Publication Data
US 2017/0155912 A1    Jun. 1, 2017

(30) Foreign Application Priority Data
Jun. 27, 2014 (EP) ..................................... 14174761

(51) Int. Cl.
*H04N 19/167* (2014.01)
*H04N 19/119* (2014.01)
(Continued)

(52) U.S. Cl.
CPC ........ *H04N 19/167* (2014.11); *H03M 7/6023* (2013.01); *H04L 65/608* (2013.01);
(Continued)

(58) Field of Classification Search
CPC ............. H04N 19/167; H04N 21/4334; H04N 19/119; H04N 65/608; H04N 19/176;
(Continued)

(56) References Cited

U.S. PATENT DOCUMENTS 7,894,531 B1    2/2011 Cetin et al.
9,699,465 B2    7/2017 Ouedraogo
(Continued)

FOREIGN PATENT DOCUMENTS

EP    1672925 A1    6/2006
EP    2775701 A1    9/2014
(Continued)

OTHER PUBLICATIONS

Concolato, C., et al., "Usage of DASH SRD for HEVC Tiling," ISO Contribution ISO/IEC JTC1/SC29/WG11 MPEG2014 (2014).
(Continued)

*Primary Examiner* — Uzma Alam
(74) *Attorney, Agent, or Firm* — Hamilton, Brook, Smith & Reynolds, P.C.

(57) ABSTRACT

A method is described of streaming HEVC-tiled video data to a client device comprising: providing said client device with a spatial manifest file comprising one or more spatial segments identifiers for locating one or more delivery nodes configured for delivering video data associated with a spatial segment identified by at least one of said one or more spatial segments identifiers, preferably (part of) one or more URLs, to said client device, a spatial segment being associated with HEVC-tiled video data comprising a subset of HEVC tiles of a HEVC-tiled (panorama) video stream; and, selecting a spatial segment identifier in said spatial manifest file for requesting a delivery node to deliver at least part of the video data of a spatial segment as a HEVC-tiled video stream to the client device.

14 Claims, 12 Drawing Sheets

(51) Int. Cl.
| | |
|---|---|
| H04L 29/06 | (2006.01) |
| H04N 19/176 | (2014.01) |
| H04N 21/433 | (2011.01) |
| H04N 21/437 | (2011.01) |
| H04N 21/81 | (2011.01) |
| H04N 21/845 | (2011.01) |
| H04N 21/854 | (2011.01) |
| H04N 21/858 | (2011.01) |
| H03M 7/30 | (2006.01) |
| H04L 29/08 | (2006.01) |
| H04N 21/2343 | (2011.01) |
| H04N 21/6547 | (2011.01) |

(52) U.S. Cl.
CPC .............. *H04L 67/02* (2013.01); *H04L 67/06* (2013.01); *H04N 19/119* (2014.11); *H04N 19/176* (2014.11); *H04N 21/23439* (2013.01); *H04N 21/437* (2013.01); *H04N 21/4334* (2013.01); *H04N 21/6547* (2013.01); *H04N 21/816* (2013.01); *H04N 21/8451* (2013.01); *H04N 21/8455* (2013.01); *H04N 21/8456* (2013.01); *H04N 21/8586* (2013.01); *H04N 21/85406* (2013.01)

(58) Field of Classification Search
CPC .............. H04N 21/8455; H04N 21/437; H04N 21/816; H04N 21/23439; H04N 21/85406; H04N 21/8451; H04N 21/6547; H04N 21/8456; H04N 21/8586; H04L 67/02; H04L 67/06; H04L 65/608; H04M 7/6023
See application file for complete search history.

(56) References Cited

U.S. PATENT DOCUMENTS

| | | | |
|---|---|---|---|
| 9,749,627 B2 | 8/2017 | Wu | |
| 9,794,649 B2 | 10/2017 | Denoual et al. | |
| 9,860,572 B2 * | 1/2018 | van Deventer | H04L 29/06 |
| 9,883,011 B2 * | 1/2018 | Denoual | H04L 67/42 |
| 9,906,807 B2 | 2/2018 | Denoual et al. | |
| 10,182,241 B2 | 1/2019 | Li | |
| 10,200,721 B2 | 2/2019 | Denoual et al. | |
| 10,212,491 B2 | 2/2019 | Denoual et al. | |
| 10,257,247 B2 | 4/2019 | Denoual et al. | |
| 10,397,666 B2 | 8/2019 | Thomas | |
| 10,542,258 B2 | 1/2020 | Wang et al. | |
| 10,542,274 B2 | 1/2020 | Li | |
| 10,547,914 B2 | 1/2020 | Denoual et al. | |
| 2006/0120610 A1 | 6/2006 | Kong et al. | |
| 2006/0262345 A1 | 11/2006 | Le Leannec et al. | |
| 2009/0300692 A1 | 12/2009 | Mavlankar et al. | |
| 2010/0135575 A1 | 6/2010 | Guo | |
| 2010/0232504 A1 | 9/2010 | Feng | |
| 2011/0096990 A1 | 4/2011 | Lu | |
| 2013/0235270 A1 | 9/2013 | Sasaki et al. | |
| 2014/0079126 A1 | 3/2014 | Ye et al. | |
| 2014/0089990 A1 | 3/2014 | van Deventer et al. | |
| 2014/0341549 A1 | 11/2014 | Hattori | |
| 2015/0032901 A1 | 1/2015 | Wang et al. | |
| 2015/0095450 A1 | 4/2015 | Vitthaladevun | |
| 2015/0208103 A1 | 7/2015 | Guntur et al. | |
| 2015/0237166 A1 * | 8/2015 | Denoual | H04N 21/6332 709/217 |
| 2015/0264404 A1 | 9/2015 | Hannuksela | |
| 2016/0165309 A1 | 6/2016 | Thomas et al. | |
| 2016/0182927 A1 | 6/2016 | Denoual et al. | |
| 2017/0013279 A1 | 1/2017 | Puri | |
| 2017/0118540 A1 | 4/2017 | Thomas et al. | |
| 2017/0180444 A1 | 6/2017 | Denoual et al. | |
| 2017/0223083 A1 * | 8/2017 | Maze | H04N 21/234327 |
| 2018/0242028 A1 | 8/2018 | Van Brandenburg et al. | |
| 2018/0295400 A1 | 10/2018 | Thomas | |
| 2019/0208234 A1 | 7/2019 | Van Brandenburg et al. | |

FOREIGN PATENT DOCUMENTS

| | | | |
|---|---|---|---|
| EP | 2 814 243 | 12/2014 | |
| GB | 2505912 | 3/2014 | |
| GB | 2 513 139 | 10/2014 | |
| GB | 2524531 | 9/2015 | |
| JP | 2005142654 | 6/2005 | |
| JP | 2012049806 | 3/2012 | |
| WO | WO 2001/95513 A1 | 12/2001 | |
| WO | 2008/088772 | 7/2008 | |
| WO | WO 2009/003885 A2 | 1/2009 | |
| WO | WO 2012/168356 | 12/2012 | |
| WO | WO 2012/168365 | 12/2012 | |
| WO | WO 2013/063094 | 5/2013 | |
| WO | WO-2013063094 A1 * | 5/2013 | ........... H04N 19/436 |
| WO | WO 2014/057131 | 4/2014 | |
| WO | WO 2014/0106651 | 7/2014 | |
| WO | WO 2014/111423 | 7/2014 | |
| WO | WO 2014/168972 | 10/2014 | |
| WO | 2015/011109 | 1/2015 | |
| WO | WO 2015/004276 A2 | 1/2015 | |
| WO | WO 2015/008774 A1 | 1/2015 | |
| WO | WO 2015/014773 A1 | 2/2015 | |
| WO | WO 2015/059194 | 4/2015 | |
| WO | WO 2015/104451 | 7/2015 | |
| WO | WO 2015/197815 A1 | 12/2015 | |
| WO | WO 2015/197818 A1 | 12/2015 | |
| WO | 2017/029400 | 2/2017 | |
| WO | 2017/029402 | 2/2017 | |
| WO | WO 2017/060423 | 4/2017 | |

OTHER PUBLICATIONS

Hirabayashi, M., et al., "Consideration on HEVC Tile Tracks in MPD for DASH SRD," ISO Contribution ISO/IEC JTC1/SC29/WG11 MPEG2014 (2014).

Sanchez, et al., "Low Complexity Cloud-video-mising using HEVC," 11th annual IEEE CCNC—Multimedia networking, services and applications, 214-218 (2014).

Tokumo, Y, et al., "Dash: Signaling Tile Encapsulation Modes," ISO Contribution ISO/IEC JTC1/SC29/WG11 MPEG2014 (2014).

Giladi, A. et al, "Descriptions of Core Experiments on DASH Amendment," Systems subgroup/DASH, International Organisation for Stardardisation Organisation Internationale de Normalisation ISO/IEC JTC1/SC29/WG11 Coding of Moving Pictures and Audio, ISO/IEC JTC1/SC29/WG11 MPEG2013/N13977, Geneva, Switzerland, 24 pages (Nov. 2013).

Hirabayashi, M. et al, "Improvement on HEVC Tile Track for WD of 14496-15 AMD1," SONY Corporation Proposal, International Organisation for Stardardisation Organisation Internationale de Normalisation ISO/IEC JTC1/SC29/WG11 Coding of Moving Pictures and Audio, ISO/TEC JTC1/SC29/WG11 MPEG2014/M33083, Valencia, Spain, 4 pages (Mar. 2014).

Lee, et al., "Scalable roi Algorithm for H.264/SVC-based Video Streaming," Consumer Electronics, IEEE Transactions 57(2): 882-887 (2011).

Le Feuvre, J., et al., "Support for Efficient Tile Access in the HEVC File Format," Telecom Paris Tech, Canon Research Centre France (2013).

Hannuksela, M.M., et al., "Isolated Regions in Video Coding," *IEEE Transactions on Multimedia*, 6(2): 259-267 (Apr. 1, 2004).

Wang, Y-K., et al., "Tile Groups," Joint Collaborative Team on Vide Coding (JCT-VC) of ITU-T SG16 WP3 and ISO/IEC JTC1/SC29/WG11, 7th Meeting: Geneva, CH, pp. 1-9 (Nov. 21-30, 2011).

Mavlankar, A., et al., "An Interactive Region-of-Interest Video Streaming System for Online Lecture Viewing," Information Systems Laboratory, Department of Electrical Engineering, Stanford University, Proc. of 18th International Packet Video Workshop, pp. 64-71, Dec. 2010.

(56) References Cited

OTHER PUBLICATIONS

Notification Of Transmittal Of The International Searching Report And The Written Opinion Of The International Searching Authority, Or The Declaration, from International Application No. PCT/EP2015/064527; dated Sep. 14, 2015; Entitled: "HEVC-Tiled Video Streaming".

Ye, Y., et al., "ROI Tile Sections," *MPEG Meeting, Shanghai*, pp. 1-7 (2012).

European Search Report for EP Application No. 14174761.8, dated Sep. 2, 2014.

Notice of Allowance in U.S. Appl. No. 15/318,631, entitled "Determining A Region Of Interest On The Basis Of A HEVC-Tiled Video Stream," dated Apr. 17, 2019.

* cited by examiner

```xml
<?xml version="1.0" encoding="UTF-8"?>
<MPD
xmlns:xsi="http://www.w3.org/2001/XMLSchema-instance"
xmlns="urn:mpeg:dash:schema:mpd:2011"
xsi:schemaLocation="urn:mpeg:dash:schema:mpd:2011 DASH-MPD.xsd"
[...]>

<Period>

<!-- Panorama with 7680 by 2160 pixels -->
  <AdaptationSet [...]>
    <EssentialProperty schemeIdUri="urn:mpeg:dash:srd:2014" value="1, 0, 0, 0, 0, 0, 1"/>
    <Representation width=0 height=0 id="panorama_2_4K" bandwidth="5000000">
      <BaseURL>full_panorama_2_4K-base.mp4</BaseURL>
    </Representation>
  </AdaptationSet>

<!-- Half Panorama (left part) -->
  <AdaptationSet [...]>
    <ContentComponent id="0" contentType="video"/>
    <SupplementalProperty schemeIdUri="urn:mpeg:dash:srd:2014" value="1, 0, 0, 3840, 2160, 7680, 2160, 1"/>
    <Representation id="left" bandwidth="512000" depedencyId="panorama_2_4K">
      <BaseURL>full_panorama-left.mp4</BaseURL>
      <SubRepresentation contentComponent="0" codecs="hvt1.1.2.H93.B0">
        <SupplementalProperty schemeIdUri="urn:mpeg:dash:srd:2014" value="1, 0, 0, 1920, 1080, 7680, 2160, 1"/>
      </SubRepresentation>
      <SubRepresentation contentComponent="0" codecs="hvt1.1.2.H93.B0">
        <SupplementalProperty schemeIdUri="urn:mpeg:dash:srd:2014" value="1, 1920, 0, 1920, 1080, 7680, 2160, 1"/>
      </SubRepresentation>
      <SubRepresentation contentComponent="0" codecs="hvt1.1.2.H93.B0">
        <SupplementalProperty schemeIdUri="urn:mpeg:dash:srd:2014" value="1, 0, 1080, 1920, 1080, 7680, 2160, 1"/>
      </SubRepresentation>
      <SubRepresentation contentComponent="0" codecs="hvt1.1.2.H93.B0">
        <SupplementalProperty schemeIdUri="urn:mpeg:dash:srd:2014" value="1, 1920, 1080, 1920, 1080, 7680, 2160, 1"/>
      </SubRepresentation>
      <SegmentBase indexRange="7632" />
    </Representation>
  </AdaptationSet>
  ...
```

Fig. 5A

```
<?xml version="1.0" encoding="UTF-8"?>
<MPD
  xmlns:xsi="http://www.w3.org/2001/XMLSchema-instance"
  xmlns="urn:mpeg:dash:schema:mpd:2011"
  xsi:schemaLocation="urn:mpeg:dash:schema:mpd:2011 DASH-MPD.xsd"
  [...]>
  <Period>
  <!--Full Panorama in 1920 by 1080 pixels-->
  <AdaptationSet width=1920 height=1080 [...]>
    <ContentComponent id="0"  contentType="video"/>              616
    <SupplementalProperty schemeIdUri="urn:mpeg:dash:srd:2014" value="1, 0, 0, 1920, 1080, 1920, 1080, 1"/>
    <Representation id="pano1" bandwidth="512000" codecs=" hvc1.1.2.L93.B0 ">        618
      <BaseURL>full_panorama-HD.mp4</BaseURL>                  614
      <SegmentBase indexRange="7632" />             632₁
    </Representation>
  </AdaptationSet>
  ...
```

HEVC-TILED VIDEO STREAMING

This application is the U.S. National Stage of International Application No. PCT/EP2015/064527, filed Jun. 26, 2015, which designates the U.S., published in English, and claims priority under 35 U.S.C. §§ 119 or 365(c) to EP Application No. 14174761.8, filed Jun. 27, 2014. The entire teachings of the above applications are incorporated herein by reference.

FIELD OF THE INVENTION

The invention relates to HEVC-tiled video streaming, and, in particular, though not exclusively, to a method of streaming HEVC-tiled video data to a client device, a client device for processing HEVC-tiled video data, a non-transitory computer-readable storage medium comprising a recording area for storing HEVC-tiled video data and data structures associated with HEVC-tiled video data and a computer program product using such method.

BACKGROUND OF THE INVENTION

Over the past few years, advances in both camera and image processing technologies not only enable recording in ever higher resolutions, but also enable stitching the output of multiple cameras together, allowing a set of cameras that together record in full 360 degrees in even higher resolutions than 8K×4K. These developments make it possible to change the way users experience video. Conventionally a broadcast of e.g. a football match comprises a sequence of camera shots carefully aligned and controlled by a director. In such a broadcast stream, each camera movement in the final stream corresponds to a physical alteration to the position, angle or zoom level of a camera itself. High-resolution panorama videos however, enable a user (and/or director) a certain degree of interaction with the video the user (and/or director) is watching (directing) without having to manipulate the camera in a physical sense. Using pan-tilt-zoom interaction, it is possible to extract from the high-resolution panorama video a sub-region of the video a user or director is interested in. This sub-region may be referred to as the region of interest (ROI).

Since in this particular use case a specific user is, at any given instant in time, only watching a subset of the full video panorama, bandwidth requirements can be reduced by sending only the part of the video the user is interested in. There are a number of techniques with which such functionality can be achieved. One of these techniques is the so-called tiled streaming technique, with which the full video panorama is divided into multiple independently encoded videos, whereby the client device, also referred to as client, has multiple decoders allowing it to reconstruct any part of the full video panorama, if necessary by stitching together a number of such independent videos.

WO2012/168365 describes content delivery systems, e.g. CDNs, for streaming spatially segmented content to clients. After requesting multiple tile streams from the network, the client (i.e. the client device) needs to buffer the different streams and multiple instances of the decoder need to be started. The client should be able to synchronize the decoders and to stitch the decoded video tiles into the full video. Hence, when switching to a tiled streaming mode comprises a large number of tile streams, the client processes may become complex and resource intensive.

Another form of tiled streaming is known from the HEVC standard, which provides a very efficient encoding and decoding scheme for video data. HEVC tiles were originally introduced in the HEVC standard for decoding of the video data using multi-core processors so that tiles in a HEVC-tiled video stream may be processed (encoded/decoded) in parallel.

Besides parallel processing, HEVC-tiles may also be used for playout of only a subset of the HEVC tiles in the video frames of a HEVC-tiled stream. The subset may e.g. relate to a region-of-interest (ROI) in the image area of the (raw) panorama video.

In that case, the HEVC tiles should be independently encoded so that the decoder is able to decode only a subset of the HEVC tiles. In order to generate such sets of independently decodable HEVC tiles, the HEVC standard allows an HEVC encoder to be configured for restricting the spatial and temporal predictions in the video coding (e.g. motion vectors and in-loop filters) within the boundaries of one or more HEVC tiles.

The absence of spatial and temporal decoding between the tiles (that is between the video data of the tiles) however would introduce a reduced compression efficiency, which could lead to a loss in video quality or an increase in the bitrate.

Hence, in order to achieve high compression rates one would require division of the frames into a few relatively large tiles. Reduction of the amount of tiles however would reduce the amount of parallelism that can be achieved thereby limiting the encoding and decoding speed. When dividing the frames of a video into a large number of small tiles, a high level of parallelism could be achieved however the compression efficiency would be substantially reduced.

Furthermore, when managing multiple independent HEVC tiles at transport level one could format the video data as a single HEVC-tiled stream. In that case however the video data of all HEVC-tiles should be transmitted to the client and tiles can only be manipulated at decoder level. Alternatively, one could format the multiple independent HEVC tiles as separate streams so that only a subset of HEVC tiles needs to be streamed to the client. Such scheme would introduce a large number of HTTP requests in order to request all temporal segments of the desired set of HEVC tiles.

Hence, there is a need in the art for improved methods and systems for streaming HEVC-tiled video data. In particular, there is a need in the art for methods and systems for streaming HEVC-tiled video data that reduces the amount of network traffic and does not increase the processor load of the device.

SUMMARY OF THE INVENTION

It is an objective of the invention to reduce or eliminate at least one of the drawbacks known in the prior art. In a first aspect the invention may relate to a method of selecting and/or streaming HEVC-tiled video data to a client device.

In an embodiment, the method may comprise providing said client device with a spatial manifest file comprising one or more spatial segments identifiers for locating one or more delivery nodes configured for delivering video data associated with a spatial segment identified by at least one of said one or more spatial segments identifiers, preferably (part of) one or more URLs, to said client device, a spatial segment being associated with HEVC-tiled video data comprising a subset, preferably a plurality, of HEVC tiles of a HEVC-tiled (panorama) video stream; and, selecting a spatial segment identifier of said spatial manifest file for requesting a delivery node to deliver at least part of the video data of a spatial segment as a HEVC-tiled video stream to the client device.

In an embodiment, the method may include using said selected spatial segment identifier for sending a request, preferably an HTTP request, to said delivery node for delivering video data associated with said spatial segment to said client device.

The invention thus relates to a data structure defining a subset of HEVC tiles (i.e. one or more HEVC tiles) of a full set of HEVC tiles of a HEVC-tiled video (e.g. a HEVC-tiled panorama video). The subset of HEVC-tiles may be referred to as a so-called spatial segment, wherein the spatial segment defines part of an image frame within the full image frames of the full HEVC-tiled video stream (e.g. a HEVC tiled panorama video). The video data of a spatial segment may be stored as an independently decodable video data in a file that can be accessed by the client device, e.g. an HAS enabled client device (also referred to as a HAS client device or simply HAS client), using the spatial manifest file. Different spatial segments may be defined in the spatial manifest file, which is used by the client device to locate a delivery node (e.g. a media server) that can send the requested data to the client device.

The spatial manifest file comprising the spatial segments may be used by the client device in order to retrieve HEVC-tiled video data. For example, a user may select a region-of-interest (ROI), e.g. the centre of a rendered HEVC-tiled panorama video, via the user interface of the device, wherein the position of the ROI in the image area of the panorama video may at least partly coincide with the position of the spatial segment in the full image area of the panorama video. By requesting the spatial segment that (partly) spatially coincides with the ROI, video data associated with the selected ROI may be provided to the client device in a HEVC-tiled video stream.

Thus, instead of sending a plurality of requests associated with a plurality of independent tile streams before the video data can be decoded, the spatial manifest file comprising spatial segment instances allows requesting a set of HEVC-tiles on the basis of a single or at least a reduced number of request messages, e.g. HTTP request messages, and receive the video data of the spatial segment in a single HEVC-tiled video stream that can be directly processed by the HEVC decoder.

The video data of a spatial segment is formatted as a HEVC-tiled video stream so that the data can be readily decoded by a single HEVC decoder. This way network traffic and processor resources of the client device (also referred to as a user device) can be substantially reduced when compared with known tiled streaming schemes.

The concept of tiles as described in this disclosure may be supported by different video codecs. For example the High Efficiency Video Coding (HEVC) standard allows the use of independently decodable tiles (HEVC tiles). HEVC tiles may be created by an encoder that divides each video frame of a media stream into a number of rows and columns ("a grid of tiles") defining tiles of a predefined width and height expressed in units of coding tree blocks (CTB). An HEVC bitstream may comprise decoder information for informing a decoder how the video frames should be divided in tiles. The decoder information may inform the decoder on the tile division of the video frames in different ways. In one variant, the decoder information may comprise information on a uniform grid of n by m tiles, wherein the size of the tiles in the grid can be deduced on the basis of the width of the frames and the CTB size. Because of rounding inaccuracies, not all tiles may have the exact same size. In another variant, the decoder information may comprise explicit information on the widths and heights of the tiles (e.g. in terms of coding tree block units). This way video frames may be divided in tiles of different size. Only for the tiles of the last row and the last column the size may be derived from the remaining number of CTBs. Thereafter, a packetizer may packetize the raw HEVC bitstream into a suitable media container that is used by a transport protocol.

Other video codecs that allow to precisely define encoding/decoding dependencies between tiles, such that tiles within a spatial segment may contain encoding dependencies, but tiles across the boundaries of spatial segments do not contain encoding dependencies, may include the video codec VP9 of Google or—to some extent—the MPEG-4 Part 10 AVC/H.264, the Advanced Video Coding (AVC) standard. In VP9 coding dependencies are broken along vertical tile boundaries, which means that two tiles in the same tile row may be decoded at the same time. Similarly, in the AVC encoding, slices may be used to divide each frame in multiple rows, wherein each of these rows defines a tile in the sense that the media data is independently decodable. Hence, in this disclosure the term "HEVC tile" is not restricted to only tiles according to the HEVC standard, but generally defines a subregion of arbitrarily shape and/or dimensions within the image region of the video frames wherein the encoding process can be configured such that the media data within the boundaries of the tile, or when more than one tile is comprised in a spatial segment, within the boundaries of such segment, is independently decodable. In other video codecs other terms such as segment or slice may be used instead of the term "tile".

It should thus further be noted that the invention is equally suitable for use with video codecs that are different from HEVC (e.g. VP9) or are (future) derivatives from HEVC, as long as these codecs have the characteristic that they are suitable for encoding a video, whereby different regions (sub areas) of images representing the video can be independently encoded within the boundaries of a spatial segment, in a single encoding process, and whereby the independently encoded regions can be decoded in a single decoding process. The term independently refers to the notion that the coding is performed in a manner that no encoding dependencies exist between these regions across the boundaries of spatial segments.

In an embodiment, video data of HEVC tiles in said spatial segment do not have spatial and/or temporal decoding dependencies with video data of HEVC tiles in said HEVC-tiled video stream that are not part of the spatial segment.

In an embodiment, coding (decoding/encoding) constraints for a spatial segment may be summarized as follows:
1. HEVC tiles in a first spatial segment A may not have any coding dependencies on HEVC tiles in a second spatial segment B;
2. HEVC tiles in a first spatial segment A may have coding dependencies on other tiles in the spatial segment A, under the condition that:
   a. A first HEVC tile 1 in a spatial segment A at a time instance Frame N may not have any coding dependencies on a second HEVC tile 2 in the spatial segment N at time instance Frame N
   b. A HEVC tile 2 in spatial segment A at a time instance Frame N mag have coding dependencies on HEVC tile 2 of spatial segment A at an earlier time instance (e.g. Frame N−1) of or a later time instance (e.g. Frame N+1).

The latter condition ensures that the coding processes can be executed in parallel by different CPU cores.

In an embodiment, the spatial segment may be defined by segment boundaries that coincide with the HEVC tile boundaries in A row and column direction of said HEVC-tiled video stream. In another embodiment, the segment boundaries may enclose a rectangular area comprising an integer number of HEVC tiles (a subset of HEVC tiles) that is smaller than the number of HEVC tiles in said HEVC-tiled video stream. The integer number is preferably large than 1. Thus the HEVC tiles of said rectangular area are preferably a plurality (i.e. a multiple). Hence, the image area associated with a spatial segment may define a small part of the full image area of the full HEVC-tiled panorama video.

In an embodiment, video data of at least part of said HEVC tiles in said spatial segment are decoded in parallel by a HEVC decoder. As the spatial segment may comprise multiple HEVC tiles, the tiles may be decoded in parallel by multiple processor cores.

In an embodiment, video data of the HEVC tiles in said spatial segment do not have spatial and/or temporal decoding dependency. Hence, the video data of each HEVC tile in the spatial segment can be decoded by the HEVC decoder without any information of the other HEVC tiles in the spatial segment.

In another embodiment video data of at least part of said HEVC tiles in said spatial segment have one or more spatial and/or temporal decoding dependencies. In such an embodiment, the HEVC-tiled video stream is encoded such that within the boundaries of a spatial segment, dependencies of video data between different HEVC tiles belonging to the same spatial segment are allowed and/or exist. In that case, the HEVC-tiles in the spatial segment (i.e. a subset of HEVC tiles of a HEVC-tiled video stream) can be efficiently compressed without any further quality loss.

In an embodiment, said spatial manifest file may further comprises one or more HEVC tile identifiers, preferably (part of) one or more URLs, for locating one or more one or more delivery nodes configured for delivering video data associated with at least one HEVC tile of the subset of HEVC tiles of a spatial segment. Hence, in this embodiment, the HEVC tiles in a spatial segment may be individually accessible by a client device on the basis of the spatial manifest file.

In an embodiment, said spatial manifest file may further comprise metadata associated with said selected spatial segment, wherein said metadata may include at least one of: information for determining that the selected spatial segment is related to HEVC-tiled video data; information for determining the number and/or size of HEVC-tiles in the selected spatial segment; information for determining the position of the spatial segment and/or the position of the HEVC tiles in said spatial segment within the tiled image area of said HEVC-tiled (panorama) video stream; and/or, information for determining whether the video data of a HEVC tile of said spatial segment have one or more temporal decoding dependencies on video data of other HEVC tiles in said spatial segment. Hence, the spatial manifest file may comprise information (metadata) for the decoder so that the decoder can be initialized or configured before it receives HEVC-tiled video data that is requested by the client device on the basis of the spatial manifest file.

In an embodiment, video data associated with a spatial segment are stored in a separate tracks, wherein video data in said track may at least be partly accessible by said client device on the basis of spatial segment identifiers. In an embodiment, video data associated a HEVC tile in a spatial segment are stored in a separate track, wherein video data in said track may at least be partly accessible by said client device on the basis of one or more HEVC tile identifiers. Hence, in order to allow a client device to request video data of a spatial segment and/or video data of one or more HEVC tiles in a spatial segment, the video data may be stored as separate tracks on a computer-readable storage medium. Video data in a track may be linked with a spatial segment identifier or a HEVC tile identifier in order to allow the client device to request delivery of video data stored in one or more of tracks to a device comprising a HEVC decoder for decoding the video data and rendering video content.

In an embodiment of the invention, one or more spatial segments, preferably identifiable by spatial segment identifiers, spatially overlap. This configuration of the spatial segments has the advantage that for instance a user interaction such as panning "off screen" may be performed in an improved manner. In certain embodiments, video data related to an image area that is "off screen" at the moment that it is requested, may be retrieved. If such "off screen" image area (which is not yet displayed) is partly comprised in the video data of the tracks with spatial segments that are being retrieved, enough time may be gained before partially overlapping spatial segments of another track are being retrieved, such that the 'off screen' panning action may be perceived as seamless.

In a further aspect, the invention may relate to a client device, wherein said client device may be configured for: parsing a spatial manifest file comprising one or more spatial segments identifiers for locating one or more delivery nodes configured for delivering video data associated with a spatial segment identified by at least one of said one or more spatial segments identifiers to said client device, a spatial segment being associated with HEVC-tiled video data comprising a subset of HEVC tiles of a HEVC-tiled video stream; and, using a spatial segment identifier of said spatial manifest file for requesting a delivery node the delivery of video data of a spatial segment.

In an embodiment, a HEVC decoder may be used for decoding video data of said spatial segment that are requested by said client device on the basis of said spatial manifest file.

In another aspect, the invention may relate to a non-transitory computer-readable storage medium comprising a recording area for storing video data, wherein said recording area may comprise: video data associated with a spatial segment, said spatial segment comprising a subset of HEVC tiles of a HEVC-tiled video stream, the video data of said spatial segment being accessible on the basis of an spatial segment identifier.

In a further embodiment, video data of said one or more spatial segments are accessible on the basis of one or more spatial segment tile identifiers.

In an embodiment, video data of said one or more spatial segments are stored as separate video tracks in said recording area. In another embodiment, said recording area may further comprise at least one base track comprising one or more extractors, wherein an extractor is pointing to a video track.

In yet another aspect, the invention may relate to a non-transitory computer-readable storage medium comprising a stored data structure, preferably a spatial manifest file for use by a device, preferably a client device, or for use in the methods as described above, wherein said data structure may comprise: one or more spatial segments identifiers for locating one or more delivery nodes configured for delivering video data associated with a spatial segment identified by at least one of said one or more spatial segments identifiers, preferably (part of) one or more URLs, to said client device, a spatial segment being associated with HEVC-tiled video data comprising a subset of HEVC tiles of a HEVC-tiled video stream.

In an embodiment, said data structure may comprise one or more HEVC tile identifiers, preferably (part of) one or more URLs, for locating one or more one or more delivery nodes configured for delivering video data associated with at least one HEVC tile of the subset of HEVC tiles of a spatial segment.

In an embodiment, said data structure may further comprise metadata associated with said selected spatial segment, wherein said metadata may include at least one of: information for determining that the selected spatial segment is related to HEVC-tiled video data; information for determining the number and/or size of HEVC-tiles in the selected spatial segment; information for determining the position of the spatial segment and/or the position of the HEVC tiles in said spatial segment within the tiled image area of said HEVC-tiled (panorama) video stream; and, information for determining whether there the video data of a HEVC tile of said spatial segment have one or more spatial decoding dependencies on other HEVC tiles in said spatial segment.

In a further aspect, the invention may relate to a video tiling system configured for: receiving video data, preferably wide field of view (panorama) video data; encoding said video data HEVC-tiled video comprising one or more spatial segments, a spatial segment being associated with HEVC-tiled video data comprising a subset of HEVC tiles of a HEVC-tiled panorama video stream; generating a spatial manifest file associated with said HEVC-tiled video data, said spatial manifest file comprising one or more spatial segments identifiers for locating one or more delivery nodes configured for delivering video data associated with a spatial segment identified by at least one of said one or more spatial segments identifiers, preferably (part of) one or more URLs, to a client device, preferably said spatial manifest file further comprising information for determining the position of at least part of said one or more spatial segments and/or the position of HEVC tiles in a spatial segment within the tiled image area of said HEVC-tiled video stream.

The invention may also be related to computer program product comprising software code portions configured for, when run in the memory of a computer, executing the method steps according to any of the above claims.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIGS. 5A and 5B schematically depict a spatial manifest file comprising spatial segments according to an embodiment of the invention.

FIGS. 6A and 6B schematically depict a spatial manifest file comprising spatial segments according to an embodiment of the invention.

DETAILED DESCRIPTION

Figures 1A, 1B:
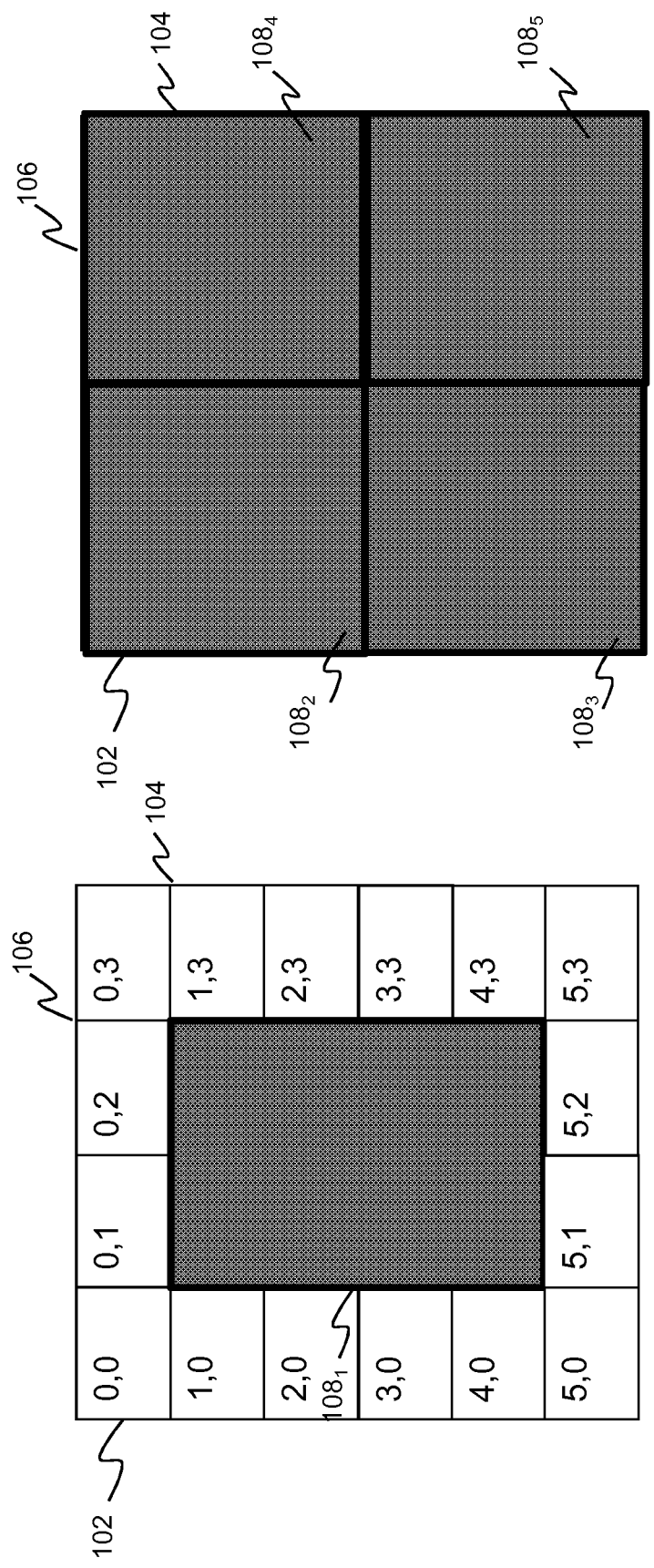
FIG. 1 depicts the concept of a spatial HEVC segment according to an embodiment of the invention.

FIGS. 1A and 1B depict schematics of a HEVC-tiled video stream according to various embodiments of the invention.

A video stream, e.g. a high-density (HD) or ultra high-density (UHD) wide field-of-view or panorama video stream, may be encoded on the basis of the HEVC video compression standard. In HEVC a video image is partitioned in so-called coding tree units (CTU), which is the basic processing unit used in the HEVC standard for the encoding and decoding process.

The HEVC encoder may be configured to divide video frames 100 in the HEVC stream in so-called HEVC tiles 102, wherein a HEVC tile is rectangular area defined by a particular grouping of CTUs. The HEVC tiles may divide the image area of the panorama video into multiple adjacent rectangular regions (which may be of different size), wherein the boundaries of the HEVC tiles are defined by HEVC tile boundaries in the column and row direction 104,106. In this application, a HEVC stream comprising HEVC tiles may be referred to as a HEVC-tiled video stream.

HEVC tiles were originally introduced in the HEVC standard for encoding and decoding of the video data using multi-core processors so that tiles in a HEVC-tiled stream may be processed (encoded and decoded) in parallel. HEVC-tiles may also be used for playout of only a subset of the HEVC tiles in the video frames of a HEVC-tiled stream. The subset may e.g. relate to a region-of-interest (ROI) in the image area of the (raw) panorama video.

In that case, the HEVC tiles should be independently encoded over time so that the decoder is able to decode only a subset of the HEVC tiles over multiple frames. In order to generate such sets of independently decodable HEVC tiles, the HEVC standard allows an HEVC encoder to be configured for restricting the temporal predictions in the video coding (e.g. motion vectors and in-loop filters) within the boundaries of one or more HEVC tiles.

The absence of temporal decoding dependency between the tiles (i.e. between the video data of different tiles) however would introduce a reduced compression efficiency, which could lead to a loss in video quality or an increase in the bitrate.

Hence, in order to achieve high compression rates one would require division of the frames into a few relatively large tiles. Reduction of the amount of tiles however would reduce the amount of parallelism that can be achieved thereby limiting the encoding and decoding speed. When dividing the frames of a video into a large number of small tiles, a high level of parallelism could be achieved however the compression efficiency would be substantially reduced.

Furthermore, when managing multiple independent HEVC tiles at transport level one could format the video data as a single HEVC-tiled stream. In that case however the video data of all HEVC-tiles should be transmitted to the client device and tiles can only be manipulated at decoder level. Alternatively, one could format the multiple independent HEVC tiles as separate streams (HEVC tile streams) so that only a subset of HEVC tiles needs to be streamed to the client device. Such scheme would introduce a large number of HTTP request in order to request all temporal segments of the desired set of HEVC tiles.

In order to address the above-mentioned problems, a set of HEVC tiles may be grouped into a so-called spatial segment, for example FIG. 1A depicts a spatial segment $108_1$ comprising a subset of HEVC tiles (in this example 8 HEVC tiles) from the full set of HEVC tiles building the HEVC-tiled video frame of a panorama video (in this example 24 HEVC segments). Similarly, FIG. 1B depicts an example of multiple spatial segments $108_2$ (in this case four spatial segments) each comprising one or more HEVC tiles (in this example six) from the full set of HEVC tiles. Although the spatial segments in FIG. 1B are of equal size, multiple spatial segments of different size (different number of HEVC tiles) are also envisaged.

The boundaries of a spatial segment coincide with the HEVC tile column and row boundaries 104,106 so that it encloses an integer number (one or more), preferably a plurality, HEVC tiles. Hence, the spatial segment defines a sub-region in the image frame comprising multiple HEVC tiles. The spatial segment thus defines an image area that is larger than an image area associate with an individual HEVC-tile and smaller than the image area of the image area of the full panorama video. Furthermore, the data format associated with a spatial segment may defined such that spatial segment can be accessed by the client device on transport level by requesting the spatial segment from a media server and receiving the video data in the spatial segment as an independent HEVC stream (a spatial segment stream).

In an embodiment, one or more HEVC tiles in a spatial segment may be configured to have one or more (temporal) decoding dependencies in previous and/or future frames and no (temporal) decoding dependencies between tiles within the spatial segment and tiles outside the spatial segment. In that case, the video data may be efficiently compressed without any further loss of quality.

In another embodiment, the HEVC tiles in a spatial segment may be configured to have one or more (temporal) decoding dependencies in previous and/or future frames and no decoding dependency between tiles within the spatial segment and tiles outside the spatial segment. In that case, the rendering of the HEVC tiles in the spatial segment may be controlled decoder level.

The position of HEVC tiles and the position of one or more spatial segments in the full image region may be determined by tile position information and segment position information respectively. The position information may be defined on the basis a coordinate system associated with the full image region. Tile position information may comprise coordinates of tile regions within the image region of said source video. This way, every HEVC tile may be related to a tile region in the image region of the HEVC video stream. On the basis of the full set of HEVC tiles and the tile position information, the full image region of the HEVC stream may be reconstructed by the HEVC decoder.

A coordinate system that is used for defining the tile position information may also be used for defining the position of a spatial segment. In case the image region relates to a 2D or 3D image region, a Cartesian coordinate system may be used. Alternatively, in case the image regions relates to a curved image region other non-Cartesian, curvilinear coordinate systems may be used, e.g. cylindrical, spherical or polar coordinate system.

Hence, from the above, it follows that a spatial segment defines HEVC-tiled video data comprising a subset of HEVC tiles from the complete set of HEVC tiles of a HEVC-tiled wide field of view video (e.g. a panorama video). In case of an HEVC-encoded bitstream, a spatial segment may be defined using the concept of a so-called motion-constrained tile set. The information defining such tile set may be defined as a SEI message in the MPEG stream. The motion-constrained tile set is defined as follows:

```
temporal_motion_constrained_tile_sets( payloadSize ) {
    mc_all_tiles_exact_sample_value_match_flag
    each_tile_one_tile_set_flag
    if( !each_tile_one_tile_set_flag ) {
        num_sets_in_message_minus1
        for( i = 0; i <= num_sets_in_message_minus1; i++) {
            mcts_id[ i ]
            num_tile_rects_in_set_minus1[ i ]
            for( j = 0; j <= num_tile_rects_in_set_minus1[ i ];
            j++) {
                top_left_tile_index[ i ][ j ]
                bottom_right_tile_index[ i ][ j ]
            }
            if( !mc_all_tiles_exact_sample_value_match_flag )
                exact_sample_value_match_flag[ i ]
        }
    }
}
``` wherein:
  each_tile_one_tile_set_flag equal 1 means that 1 tile is a tile set (a spatial segment);
  num_sets_in_message_minus1 defines the number of tile sets (the number of spatial segments);
  mcts_id[i] gives an arbitrary id for the i-th tile set
  num_tile_rects_in_set_minus1[i] defines the number of HEVC tiles in the motion-constrained tile set;
  top_left_tile_index[i][j] and bottom_right_tile_index[i][j] defines the top left and bottom right indexes of the tiles in the tile set.

Further, the mc_all_tiles_exact_sample_value_match_flag parameter is set to 1. The HEVC standard thus allows defining sets of tiles within the bitstream. As will described hereunder in more detail, the special segment data structure allows a client device to access and retrieve these tile sets on a transport level (e.g. MPEG DASH level).

Figure 2:
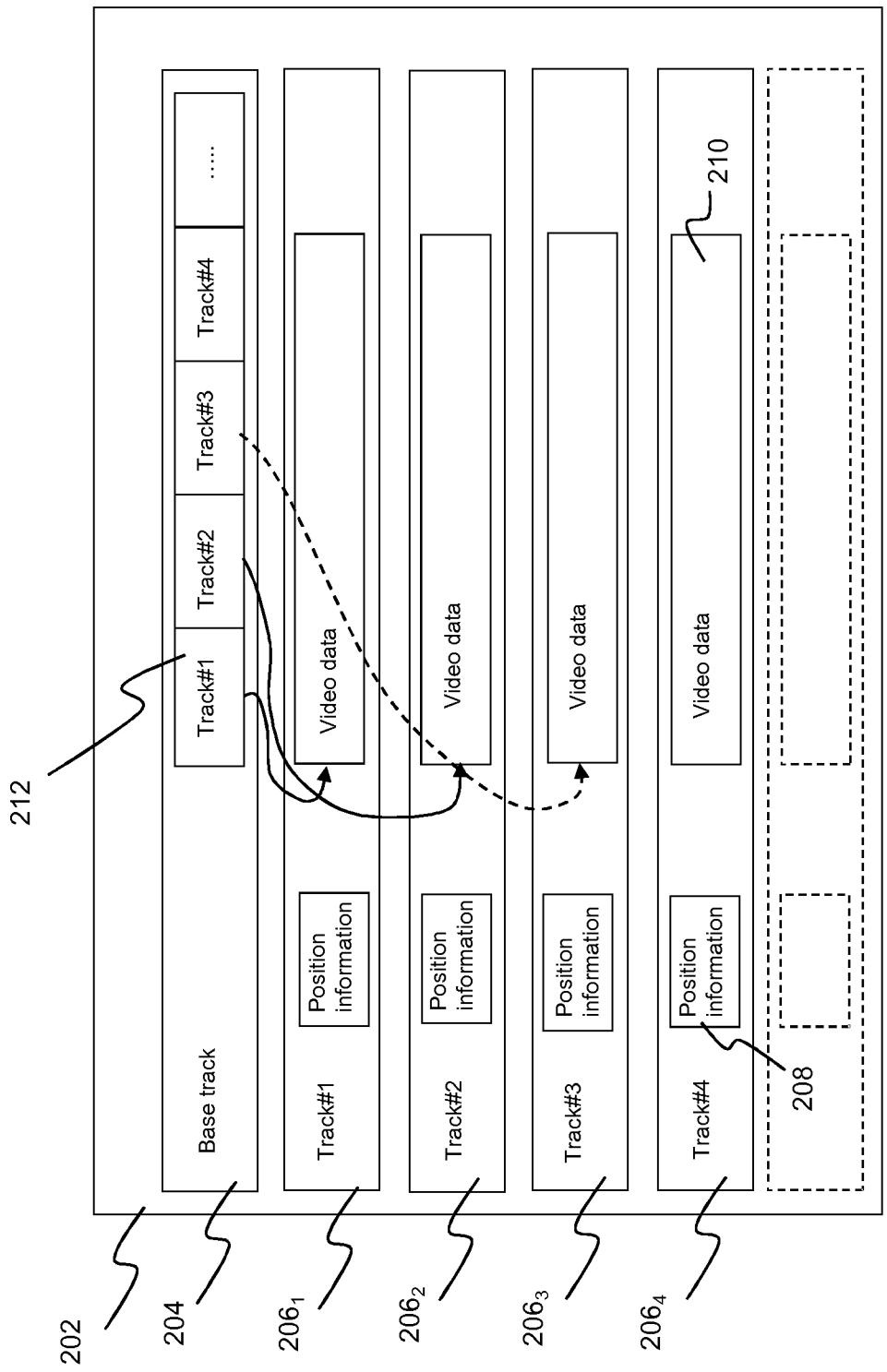
FIG. 2 depicts a data structure for HEVC-tiled video data according to an embodiment of the invention.

FIG. 2 depicts an example of data structure 200 of an HEVC-tiled video file or stream, in this particular example an MPEG-4 file 202, comprising one or more spatial segments.

In an embodiment, the video file or stream may comprise one or more (video) tracks $206_{1-4}$, which serve as a container for independently decodable video data associated with one or more spatial segments and, optionally, one or more HEVC tiles. Hence, a track may define a container comprising video data 210 wherein the spatial and temporal predictions for the video coding (e.g. motion vector and in-loop filters.) are within the boundaries of the spatial segment.

In an embodiment, a track may further comprise position information 208. The decoder may use the position information in order to determine the position of the spatial segment within the HEVC-tiled video image. In an embodiment, position information in a track may comprise an origin and size information in order to allow the decoder to position a spatial segment or a HEVC tile in a reference space wherein a position in the space may be determined by a coordinate system associated with the full image.

In a further embodiment, the data structure 200 may further comprise a so-called base track 204. The base track may comprise information that determines the sequence of the tracks that need to be decoded by HEVC decoder. In particular, the base track may comprise extractors 212, wherein an extractor defines a reference to one or more corresponding tracks. By parsing the base track, the decoder may replace an extractor with audio and/or video data of a track it refers to. The HEVC decoder thus uses the information in the base track in order to generate on the video data in the tracks a coherent bitstream for decoding.

If a particular video application does not require a particular spatial segment (or one or more HEVC tiles), the decoder may simply ignore its corresponding extractor. In that case, the absence of such track may be interpreted by the decoder as "missing data". Since the video data in the tracks are independently decodable, the absence of data from one or more tracks does not prevent the decoder from decoding other tracks that can be retrieved.

In an embodiment, an HEVC tile may be decoded independently from the other HEVC tiles, so that the absence of data from one or more tracks does not prevent the decoder from decoding other tracks that can be retrieved.

In a further embodiment, the base track may comprise video data associated with the full image region of the source video, e.g. a panorama video. The video may be selected in a quality such that it can be transported in the HEVC stream without taking up too much bandwidth.

In an embodiment, the data format depicted in FIG. 2 may be used for storing spatial segments and HEVC tiles as independent files such that a client device may request delivery of these files.

The streams depicted in FIGS. 1 and 2 may be delivered to a client device (also simply referred to as a client throughout this application) for playout using an adaptive streaming protocol such as an HTTP adaptive streaming (HAS) protocol. Examples of HTTP adaptive streaming protocols include Apple HTTP Live Streaming [http://tools.ietf.org/html/draft-pantos-http-live-streaming-13], Microsoft Smooth Streaming [http://www.iis.net/download/SmoothStreaming], Adobe HTTP Dynamic Streaming [http://www.adobe.com/products/httpdynamicstreaming], 3GPP-DASH [TS 26.247 Transparent end-to-end Packet-switched Streaming Service (PSS); Progressive Download and Dynamic Adaptive Streaming over HTTP] and MPEG Dynamic Adaptive Streaming over HTTP [MPEG DASH ISO/IEC 23001-6]. HTTP allows an efficient, firewall-friendly and scalable scheme for delivering tile streams (and segments) to clients.

Figure 3:
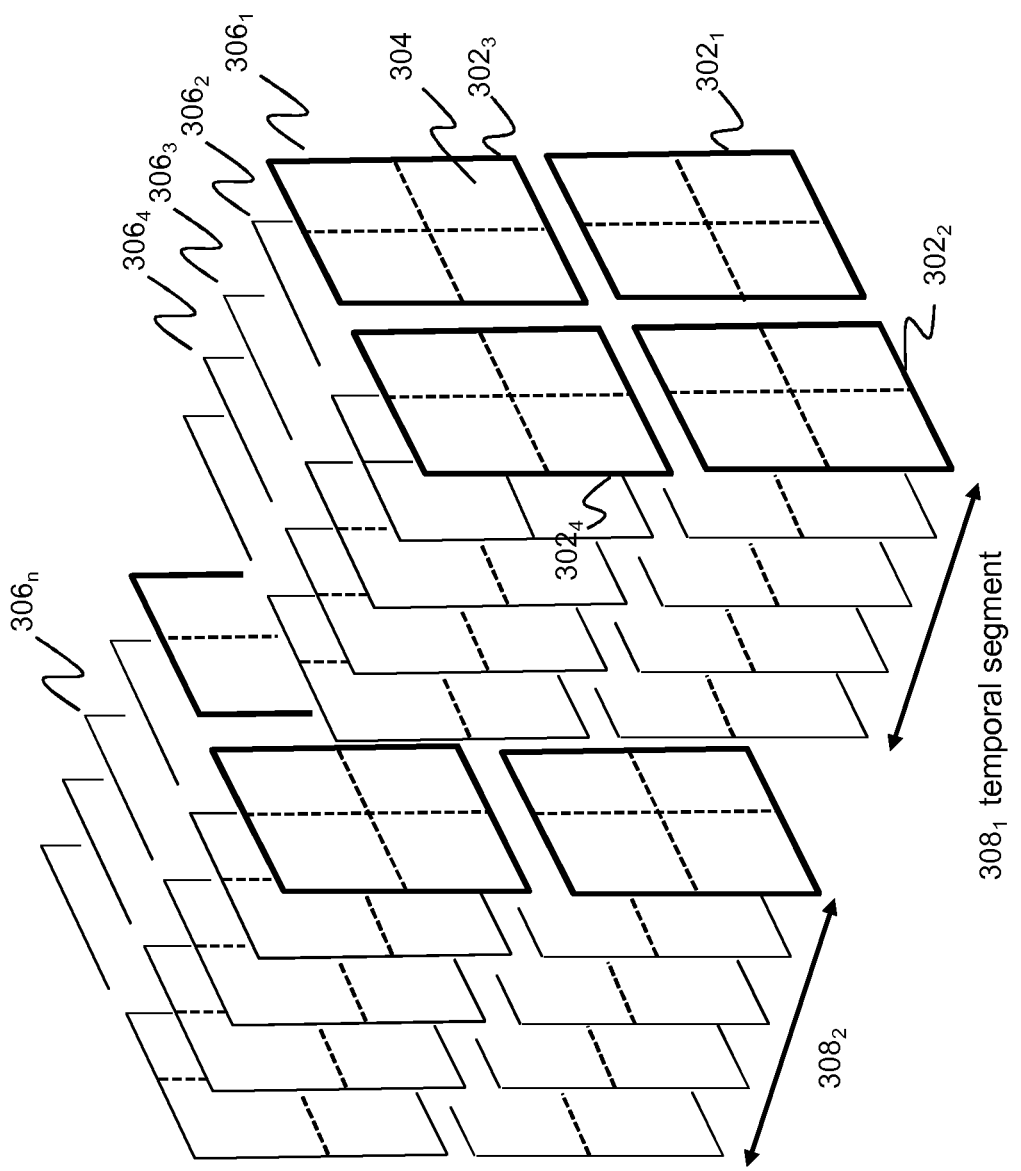
FIG. 3 depicts a schematic of a temporally segmented HEVC-tiled stream comprising spatial HEVC segments according to an embodiment of the invention.

When using a HAS protocol, the spatially divided, independently decodable video data (i.e. the video data of the spatial segments) may be temporally divided in so-called temporal segments of a predetermined time period as shown in FIG. 3.

In particular, FIG. 3 depicts a schematic of a temporally segmented HEVC-tiled stream comprising spatial segments according to an embodiment of the invention. The video frames 306$_{1-n}$ are divided in a plurality of spatial segments 302$_{1-4}$ (in this particular example 4 spatial segments), wherein each spatial segment comprises a plurality of HEVC-tiles 304. The video data associated with each spatial segment may be temporarily divided in temporal segments 308$_{1,2}$.

In an embodiment, a temporal segment may start with a media unit, e.g. an I frame, that has not coding dependencies on other frames in the temporal segment or other temporal segments so that the decoder can directly start decoding video data in the spatial segment.

The video data a spatial segment 302$_1$ may not have any decoding dependency on other spatial segments 302$_{2-4}$ of the same video frame or earlier video frames in the same temporal segment or earlier temporal segments. The video data in a temporal segment may start with a frame that can be decoded without the need of other frames. This way, a client may receive a spatial segment of a spatial segment stream and start decoding the video data of the first video frame in the spatial segment without the need of other video data.

In an embodiment, video data associated with each spatial segment may be delivered as separate HEVC-tiled streams to the client. In another embodiment, video data associated with two or more spatial segments may be delivered in one HEVC-tile stream to the client. In case, an HAS streaming protocol is used for delivering video data to an HAS client (which is a client device configured for processing video data delivered on the basis of HTTP Adaptive Streaming), a HEVC-tiled stream may be further divided in temporal segments.

Hence, tile constraints for a spatial segment may be summarized as follows:
1. HEVC tiles in a first spatial segment A may not have any coding dependencies on HEVC tiles in a second spatial segment B;
2. HEVC tiles in a first spatial segment A may have coding dependencies on other tiles in the spatial segment A, under the condition that:
   a. A first HEVC tile 1 in a spatial segment A at a time instance Frame N may not have any coding dependencies on a second HEVC tile 2 in the spatial segment N at time instance Frame N
   b. A HEVC tile 2 in spatial segment A at a time instance Frame N mag have coding dependencies on HEVC tile 2 of spatial segment A at an earlier time instance (e.g. Frame N−1) or a later time instance (e.g. Frame N+1).

The latter condition ensures that encoding and decoding processes can be parallized between different CPU cores.

The HAS client may be provided with a so-called spatial manifest file (SMF) in order to inform the HAS client about the spatial and temporal relation of the spatial segments in the HEVC-tiled stream. As will be described hereunder in more detail, an SMF may comprise stream identifiers (e.g. (part of) an URL), which a client may use in order to locate and access one or more delivery nodes (e.g. one or more media servers or a content delivery network (CDN), which are capable of delivering the temporally segmented video data associated with one or more spatial segments on the basis of a HAS protocol to a HAS client.

The client (i.e. client device) may parse the manifest file and use the information in the manifest file to request the desired (temporal and spatial) segments in order to render the video data.

As will be described hereunder in more detail, when the video data are rendered using a suitable user interface (e.g. a touch screen or a pointing device), the user interface may be configured to allow a user to interact with a displayed imaging region using a user interface and select e.g. a region of interest (ROI) that at least party coincides with a predefined spatial segment. In response to the user interaction, the user interface may generate an instruction for the client device to request HEVC-tiled video data of the spatial segment and render the video data of the spatial segment on the screen. Hence, a user may move and/or expand the ROI and—in response—an appropriate spatial segment within that tile representation may be selected in order to render video image that at least partly coincides with the ROI.

Figure 4:
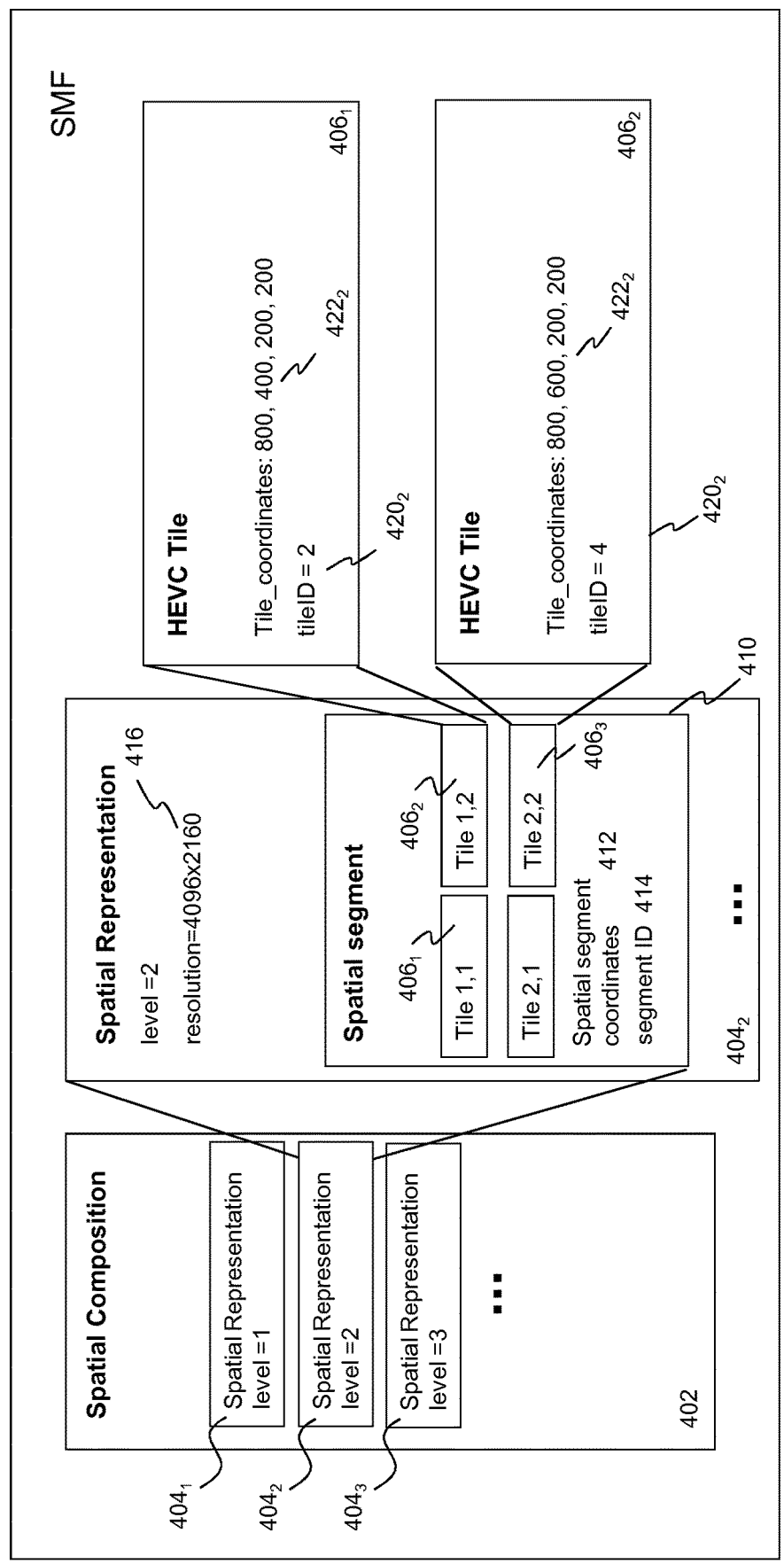
FIG. 4 schematically depicts a spatial manifest file for use by a HAS client device according to an embodiment of the invention.

FIG. 4 schematically depicts a spatial manifest file for a HAS client device according to an embodiment of the invention. The spatial manifest file (SMF) may define one or more hierarchical data levels $402,404_{1-3},410$. The first data level 402 may relate to a Spatial Composition defining one or more Spatial Representations $406_{1-3}$ of a source video (e.g. source1.mp4). The Spatial Representation may form a second data level. Typically, the source video may be formed on the basis of one or more high-resolution and, often, wide field-of-view HD or even UHD video streams or files.

A Spatial Composition may comprise different Spatial Representations $404_{1-3}$ generated by an HEVC encoder and other representations of the source file, e.g. a non-tiled low-resolution video. The Spatial Representations may differ in HEVC tile sizes, format (2D or 3D), different video and/or audio qualities and/or resolutions (e.g. SD/HD/UHD, bitrates, etc.), field-of-views, camera angles, etc.). In order to generate a Spatial Representation, the video frames of the source file may be encoded into a HEVC-tiled video file or stream comprising one or more (independently) decodable Spatial Segments that may form a third data level in the SMF. The Spatial Representation may comprise metadata. For example, in FIG. 4 the metadata in the Segment representation $404_2$ may comprise video resolution information 416 indicating that the HEVC tiles of video data of a particular Spatial Representation is associated with a 4096× 2160 video data format.

A Spatial Representation may comprise one or more Spatial Segments 410 as described in detail with reference to FIGS. 1-3. A Spatial Segment may define one or more HEVC tiles $406_{1-4}$. Further, a Spatial Segment may comprise metadata, e.g. segment position information 412 defining the position of a spatial segment in the HEVC-tiled video image. Further, the spatial segment instance may comprise a segment identifier 414, e.g. an URL, which may be used for retrieving video data associated with a Spatial Segment.

The HEVC tiles in a Spatial Segment may be defined by HEVC tile instance $406_{1-4}$. A HEVC tile instance may comprise a tile identifier $418_{1,2}$ for identifying a HEVC tile in the video data of a Spatial Segment. Further, in an embodiment, a HEVC tile instance may comprise tile position information (e.g. tile coordinates) $422_{1,2}$ defining the position of a HEVC tile in video frames of the HEVC-tiled stream.

The segment position information and the tile position information in the SMF may be generally referred to as position information. The coordinates used for defining the position of the spatial segment or an HEVC tile may be based on an absolute or a relative coordinate system and used by the HEVC decoder to spatially position the HEVC tiles into a seamless video image for display.

Figure 5B:
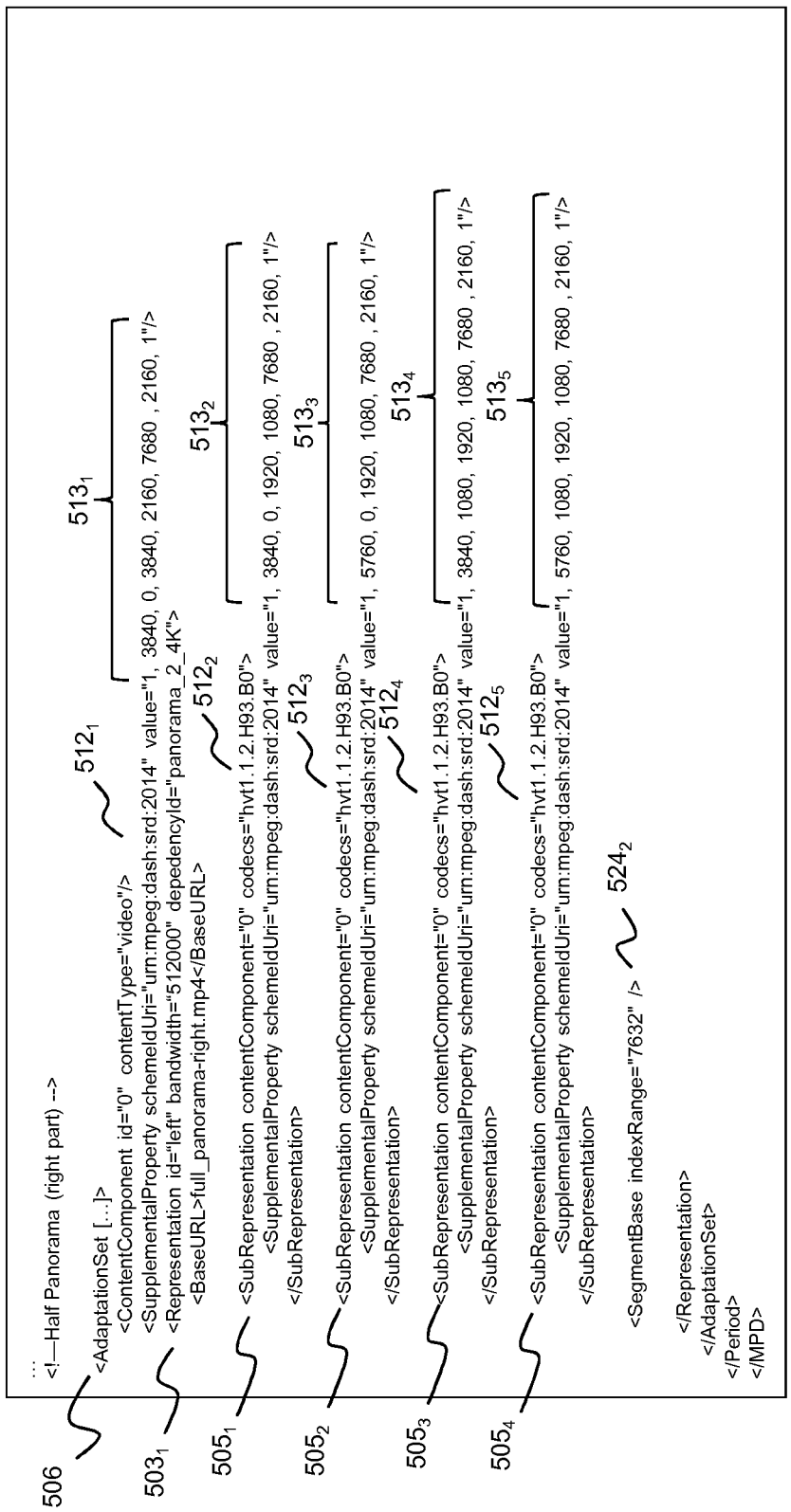

FIGS. 5A and 5B schematically depict a spatial manifest file for streaming HEVC-tiled video data to a device according to an embodiment of the invention. In particular FIGS. 5A and 5B depict an example of an MPEG-DASH MPD defining a HEVC-tiled video stream comprising spatial segments. DASH (Dynamic Adaptive Streaming over HTTP) is a streaming protocol belonging to the family of HAS protocols. The MPD may comprise different MPD video elements 502,504,506 which are associated with an identifier, e.g. (part of) an URL or URI. The DASH enabled client device (also referred to as DASH client) may use the identifier to access and retrieve the video data associated with the MPD video elements. For example, in this example, the first MPD video element 502 may be associated with at least one HEVC-tiled panorama video (a wide field-of-view video defined by the URI "full_panorama_2_4K.mp4") comprising 2×4 HEVC tiles. The second and third MPD video element may define special segments within the tiled image are of the HEVC-tiled panorama video. The second MPD video element 504 may be associated with a first spatial segment defined by a first spatial segment identifier, the URI "full_panorma-left.mp4"). This first spatial segment may comprise 4 HEVC tiles (2 by 2) and may be associated with a first (left) part of the HEVC-tiled panorama video. Similarly, the third MPD video element 506 may be associated with a second spatial segment defined by a second spatial segment identifier, URI "full_panorma-right.mp4"). This second spatial segment may comprise 4 HEVC tiles (2 by 2) and may be associated with a second (right) part of the HEVC-tiled panorama video. The spatial relationship between the MPD video elements is defined on the basis of position information, which will be described hereunder in more detail.

An MPD video element may be defined as an "AdaptationSet" attribute comprising one or more representations (different versions of the same or associated content wherein the difference may be defined by one or more encoding parameters).

A DASH client may use the information in the MPD to request video data associated with a MPD video element from the network. Furthermore, a DASH client may use information (metadata) in the MPD to configure the HEVC decoder so that it may start decoding the HEVC-tiled video data as soon as the video data are received. The information (metadata) for configuring the HEVC decoder may include the spatial relationship between the MPD video elements. To that end, the MPD author may include position information in the MPD. The position information may be defined by one or more spatial relationship descriptors (SRDs) $508,510_{1-5}$, $512_{1-5}$. An SRD may be used in the EssentialProperty attribute (information that is required to be understood by the client when processing a descriptor) or a SupplementalProperty attribute (information that may be discarded by a client when processing a descriptor) in order to inform the client that a spatial relationship between the MPD video elements exist. In an embodiment, the spatial relationship descriptor schemeIdUri "urn:mpeg:dash:srd:2014") may be used as a data structure for formatting the position information.

In an embodiment, the position information may be defined on the basis of the @value attribute $509,511_{1-5}$, $513_{1-5}$ which may comprise a sequence of parameters including but not limited to:

The source_id parameter 514 may define the set of MPD video elements (AdaptationSet or SubRepresentation) that have a spatial relationship with each other.

The position parameters 516 x,y,w,h may define the position of a MPD video element wherein the coordinates x,y define the origin of the image region of the MPD video element and w and h define the width and height of the image region. The position parameters may be expressed in a given arbitrary unit, e.g. pixel units.

The tuple W and H 518 define the dimension of the reference space expressed in an arbitrary unit which is the same as the x,y,w and h.

The spatial_set_id 520 allows grouping of MPD video elements in a coherent group. Such group of MPD video elements may be e.g. used as a resolution layer indicator.

The source parameter "1" in the position information in the different MPD video elements indicate that the different MPD video elements are spatially related to each other.

The first MPD video element 502 may be defined as an AdaptationSet wherein the values x,y,w,h,W,H of the SRD are set to 0, indicating that this MPD video element defines a base track of an MPEG4 stream wherein the base track comprises "extractors" (pointers) to the video data in the tracks defined in the other MPD video elements (in a similar way as described with reference to FIG. 2).

The second and third MPD video elements 504,506 may be defined as an AdaptationSet, comprising a Representation 503 and one or more SubRepresentations 505$_{1-4}$ (i.e. parts composing this Representation which can be linked to the concept of tracks at the container level). This way the second and third MPD video elements may define spatial segments at Representation level comprising a set of one or more HEVC tiles (in this example four HEVC tiles) that are defined at SubRepresentation level.

In an embodiment, the SubRepresentations can be also selectively requested when the range of bytes delimiting each track within a SubSegment is accessible to the client.

In an embodiment, a spatial segment may have a data format that is similar to the one depicted in FIG. 2. Each spatial segment may be stored as a separate track in the MPEG stream. The video data in a track may be encoded such that independent playout of the (temporal segments of) a spatial segment by the HEVC decoder is possible. Each tile track may comprise HEVC encoded video data as defined by the encoder attribute "codecs" 522, which refers in this example refers to an "hvt1" type codec wherein the "t" in "hvt1" refers to HEVC-tiled video data). Further, each HEVC tile in the SubRepresenation may be associated with an SRD 510$_{2-5}$ comprising one or more position parameters 511$_{2-5}$ for defining the position of the HEVC tile.

Hence, from the above it follows that the client not only use the information in the SMF to locate delivery nodes in the network node that can deliver the desired video data to the client, but also uses metadata of the HEVC-tiled video streams defined in SMF in order allow a client to select a particular ROI (e.g. a spatial segment) and to configure the decoder before the HEVC-tiled video data are received by the client. This metadata may include for example:

information for determining that the selected spatial segment is related to HEVC-tiled video data (e.g. a codec attribute "hvt1");

information for determining the number and/or size of HEVC-tiles in the selected spatial segment using (e.g. the number of HEVC-tiles that are represented as a SubRepresentation and/or part of the position information associated with the SRDs);

information for determining the position of the spatial segment and/or the position of the HEVC tiles in said spatial segment within the tiled image area of said HEVC-tiled (panorama) video stream (e.g. part of the position information associated with the SRDs);

information for determining whether there the video data of a HEVC tile of said spatial segment have one or more spatial decoding dependencies on other HEVC tiles in said spatial segment.

The SegmentBase indexRange 524$_{1,2}$ may be used in order to define a byte range (in this example bytes 0 to 7632), which allows a client to link a temporal segment number with a particular range of bytes.

Figure 6B:
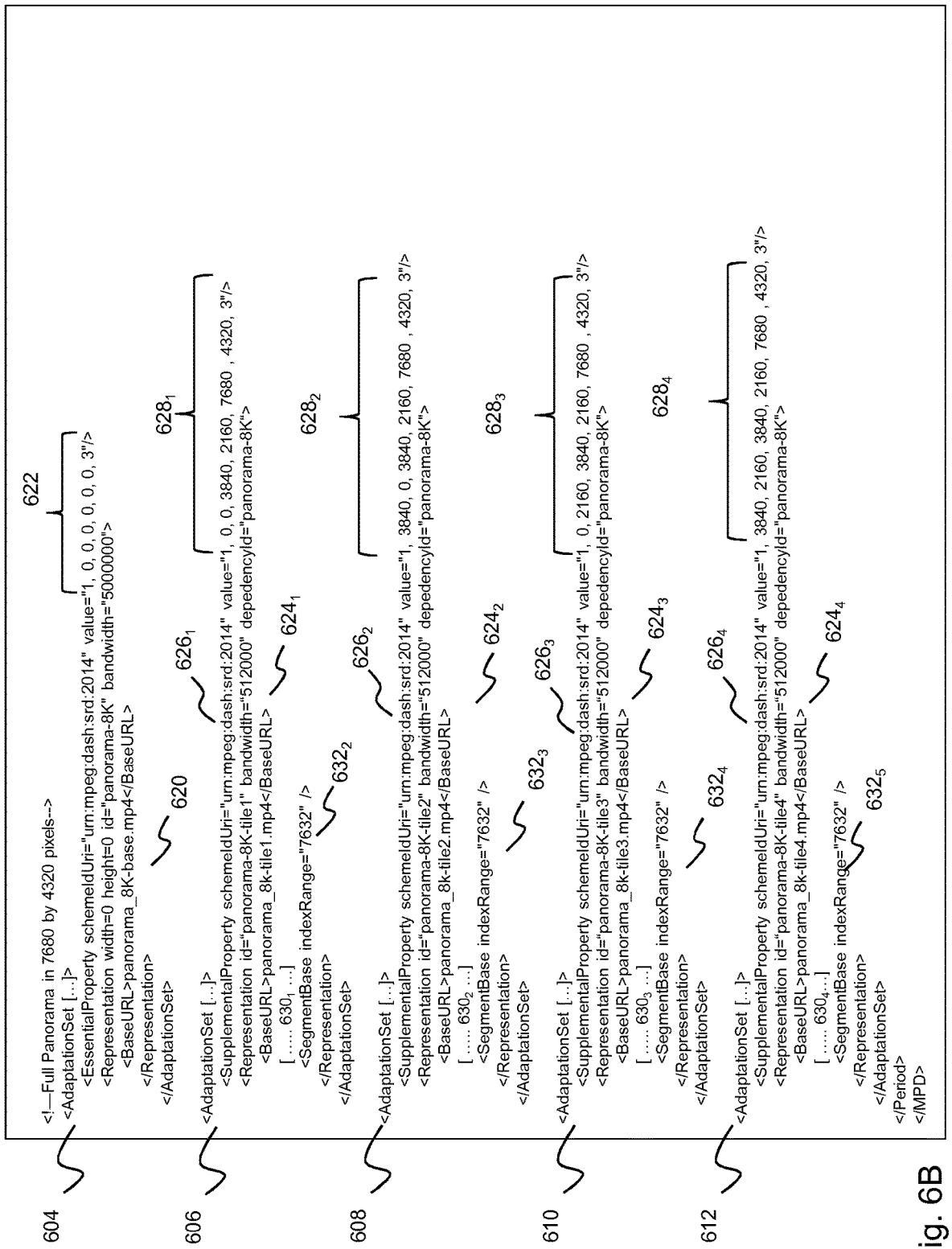

FIGS. 6A and 6B schematically depict a data structure, in particular a spatial manifest file, for streaming HEVC-tiled video data to a device, preferably a client device, according to another embodiment of the invention. In particular FIGS. 6A and 6B depict an example of an MPEG-DASH MPD defining a HEVC-tiled video stream, comprising spatial segments. In this particular case, the MPD may comprise a number of MPD video elements 602,604,606,608,610,612 wherein the spatial relationship between the different MPD video elements is described on the basis of position information in the MPD in a similar way as described above with reference to FIGS. 5A and 5B.

In this particular example, a first MPD video element 602 may define a first (low-resolution) panorama stream identified by an stream identifier 614$_1$, in this case the URI full_panorama-HD.mp4. The first MPD video element may be defined as an AdaptationSet wherein the values 618 x,y,w,h,W,H of the SRD 616 are used to describe the spatial position of the video data of the first panorama stream and its spatial relation with respect to the other MPD video elements. The video data in this stream may be encoded as a conventional HEVC stream.

In contrast, the other MPD video elements may form a group of MPD video elements defining a HEVC-tiled stream comprising one or more spatial segments. The grouping of these MPD video elements may be realized on the basis of the spatial_set_id in the SRDs of these MPD video elements. In this particular example, the spatial_set_id's of these video elements are set to "3", while the spatial_set_id of the first video element is set to "1".

The second MPD video element 604 may define a high-resolution HEVC-tiled panorama stream at Representation level, identified by a stream identifier 620, in this case the URI "panorama_8K-base.mp4" wherein its position is defined on the basis of an SRD 622. The values x,y,w,h,W,H of the SRD of the second MPD video element are set to 0, indicating that this MPD video element defines a base track of an MPEG4 stream wherein the base track comprises "extractors" (pointers) to the video data in the tracks defined in the other MPD video elements in a similar way as described with reference to FIG. 2. In this particular case, each track may comprise video data of a spatial segment comprising one or more HEVC tiles.

In this example, the other four MPD video elements 606,608,610,612 define four spatial segments that are also defined at Representation level. Each spatial segment may be identified by a spatial segment identifier 624$_{1-4}$ and each spatial segment may be associated with an SRD 626$_{1-4}$ and parameter values 628$_{1-4}$ in order to describe the spatial position of the spatial segment and its spatial relation with respect to the other MPD video elements.

The HEVC-tiles in the spatial segment may be described on the basis of a number of SubRepresentations 630$_{1-4}$ (similar to SubRepresentations 505$_{1-4}$ in FIG. 5A) within the respective Representation of a spatial segment. Hence, the number of SubRepresentations in the Represenation of the spatial segment provides the number of HEVC-tiles in a spatial segment.

A spatial segment may be stored as a separate track in the MPEG stream as described with reference to FIG. 2 above. The video data in a track may be encoded such that independent playout of the (temporal segments of) a spatial segment by the decoder is possible. A spatial segment may comprise a number of HEVC tiles as shown by the encoder attribute "codecs" which refers to an "hvt1" type codec (the tin hvt1 refers to tile). Further, a HEVC tile in the SubRepresenation may be associated with an SRD comprising one or more position parameters for defining the position of the HEVC tile and its position with respect to other MPD video elements defined in the MPD in a similar way as described with reference to FIGS. 5A and 5B.

On the basis of the MPDs as depicted in FIGS. 5A and 5B and FIGS. 6A and 6B, an DASH client may request different streams on the basis of the information associated with the MPD video elements, e.g. a low-resolution panorama video stream, a HEVC-tiled high-resolution panorama video stream or one or more spatial segments comprising HEVC-tiles. Further, on the basis of the MPDs as depicted in FIGS. 5A and 5B and FIGS. 6A and 6B, a DASH client may send metadata associated with a requested stream to the HEVC decoder in order to configure and initialize the decoder so that is ready for decoding the video data as soon as the data are received by the client.

The SegmentBase indexRange $632_{1-5}$ may be used in order to define a byte range (in this example bytes 0 to 7632) which allows a client to link a temporal segment number with a particular range of bytes.

Figure 7:
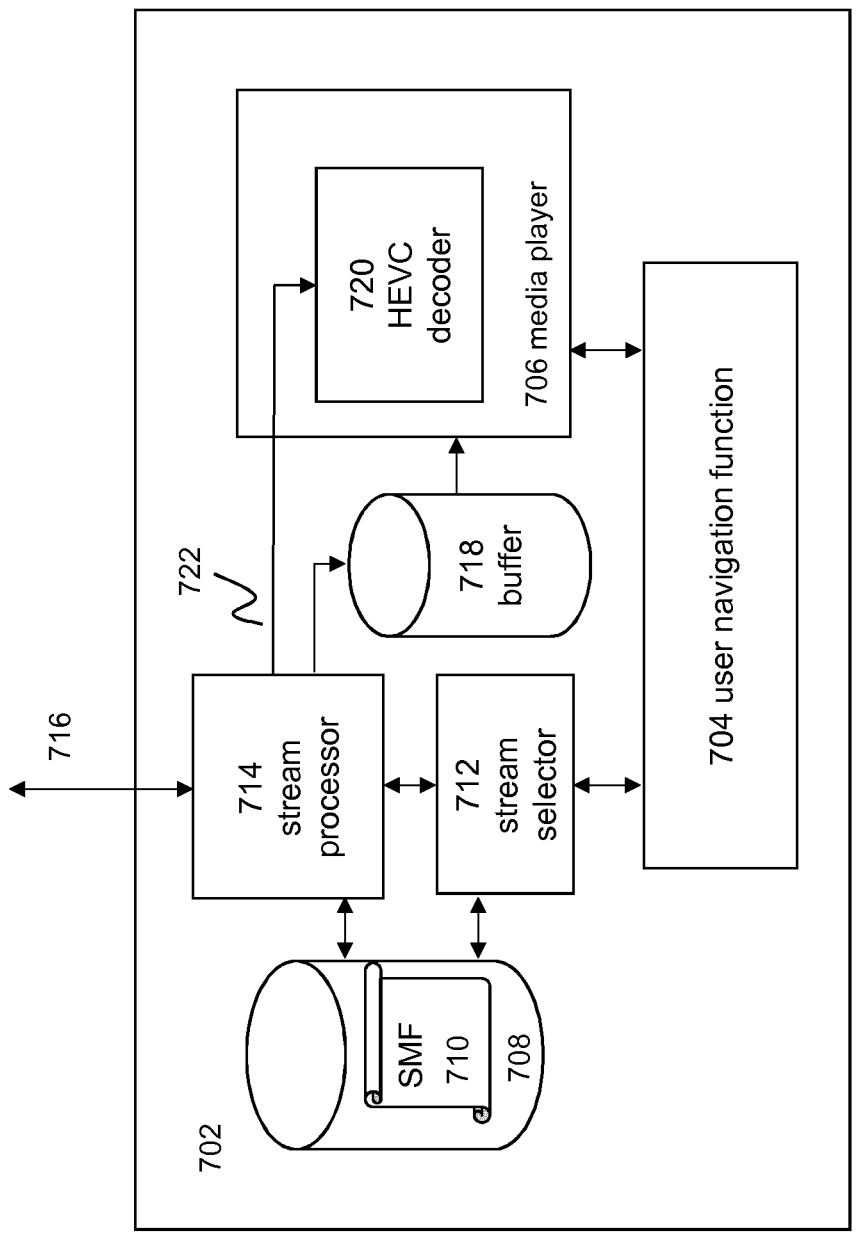
FIG. 7 depicts a client device configured to rendering HEVC-tiled video data on the basis of a spatial manifest file according to an embodiment of the invention.

FIG. 7 depicts a client device for retrieving and processing HEVC-tiled video data according to one embodiment of the invention. The client device 702 may comprise a user navigation function 704 for interpreting user interaction with the (tiled) content that is processed and rendered by a media player 706. The user navigation function may be connected to a user interface that may include a touch-screen, a camera, keyboard, mouse, trackerball, joystick, microphone, head tracking sensor, eye and gaze tracking, buttons or any other man-machine interface that allows manipulation (e.g. panning, zooming and/or tilting) of the displayed content.

The client device may further comprise a manifest cache 708 for receiving and storing one or more manifest files from a content provider and/or a content source in the network (e.g. a media server or a CDN). The cache may comprise one or more SMFs 710 wherein an SMF may comprise one or more spatial segments as described in detail with reference to FIGS. 1-6 above.

The manifest cache may be connected to a stream selector 712 that may parse the SMF and use the information in the SMF to select one or more streams and instruct a stream processor 714 to request the one or more selected streams from the network 716 on the basis of a suitable protocol, e.g. the HTTP protocol or the like.

When selecting a HEVC-tiled stream, e.g. a spatial segment, the stream processor may send information 722 (metadata) on the selected stream to configure the HEVC decoder 720. For example, when a particular spatial segment is selected from the SMF, the stream processor may send metadata associated with the spatial segment (e.g. information regarding the fact that the video data relates to HEVC-tiled video data, that the video data are defined as a spatial segment comprising a number of HEVC tiles, the position information associated with the spatial segment and its HEVC tiles, etc.). This way, the HEVC decoder may be configured and initialized for processing the requested HEVC-tiled stream before the video data have been received. Thereafter, the stream processor may use the SMF in order to request a desired spatial segment. To that end, the stream process may send requests for the base track and one or more tracks associated with one or more spatial segments. Once the stream processor starts receiving the requested video data, it may relay the data of the base track and video data associated one or more spatial tracks to a buffer 718 before the data are decoded by an HEVC decoder 720 in the media player.

Figure 8:
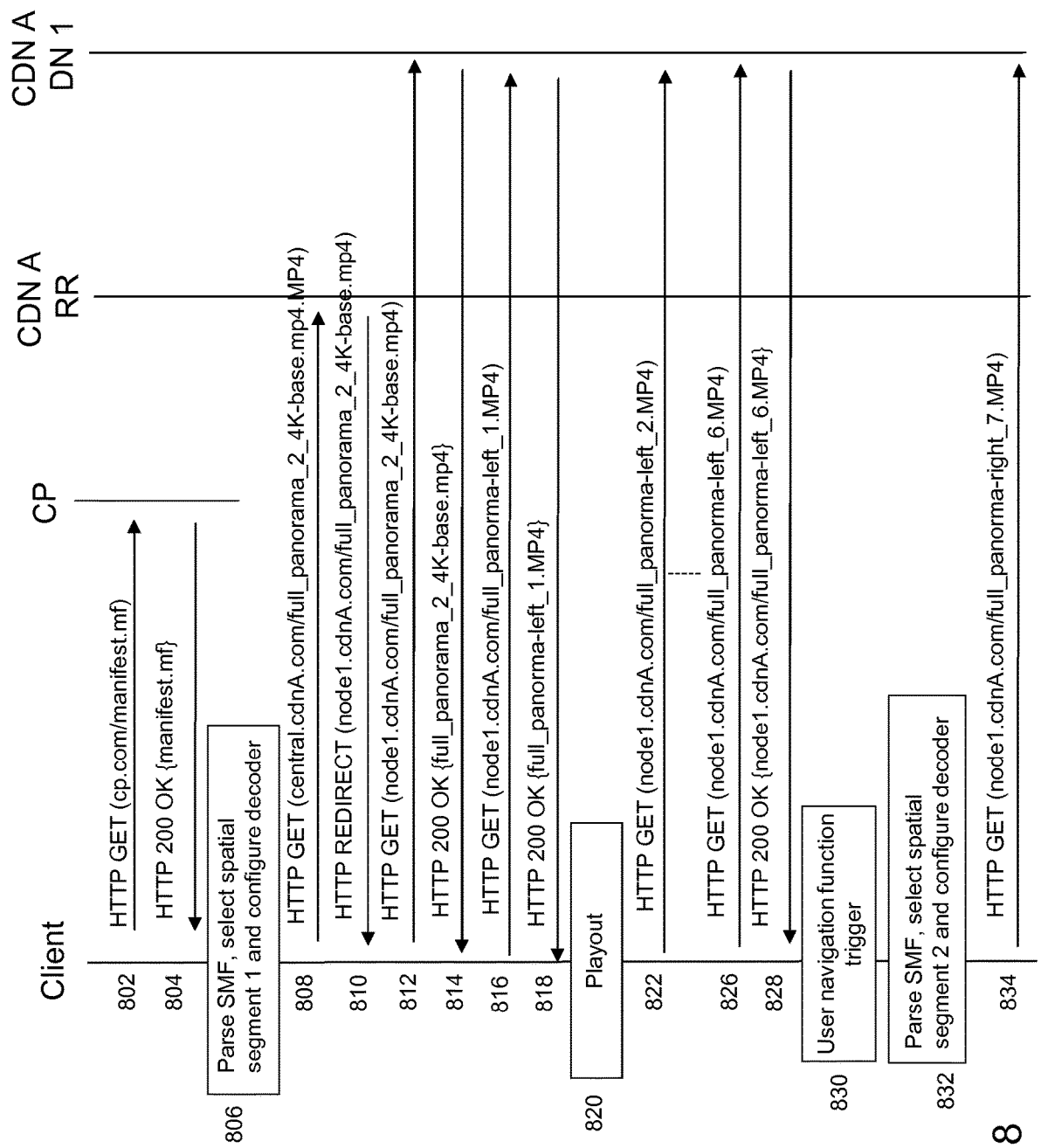
FIG. 8 schematically depicts a flow diagram of a streaming HEVC-tiled video data on the basis of a spatial manifest file according to an embodiment of the invention.

FIG. 8 depicts a HEVC-tiled streaming process according to an embodiment of the invention. In this particular example, the video data may be distributed by a so-called content delivery network (CDN) to clients (i.e. client devices) using an HAS protocol. The process may start with a client requesting and receiving a spatial manifest file SMF from a content provider CP (steps 802 and 804). The SMF may for example relate to an MPD as described with reference to FIGS. 5A and 5B defining a HEVC-tiled panorama video (2×4 HEVC tiles) with two spatial segments: a first spatial segment "full_panorama-left.MP4" with 2×2 HEVC tiles defining the left sub-region of the full panorama and a second spatial segment "full_panorama-right.MP4" with 2×2 HEVC tiles defining the right sub-region of the full panorama.

The client, in particular the stream selector in the client, may parse the SMF and select e.g. a spatial segment identifier, e.g. "full_panorma-left.MP4" and the associated base track "full_panorama_2_4K-base.mp4" (step 806). Further, it may retrieve metadata associated with the selected segment (e.g. information regarding the fact that the selected video data relates to HEVC-tiled video data, that the selected video data are defined as a spatial segment comprising a number of HEVC tiles, the position information associated with the spatial segment and its HEVC tiles, etc.).

Thereafter the client may send a request for the base track to the network. In particular, the client may send a request message (step 808), e.g. an HTTP GET message, comprising an identifier of the base track (e.g. an URL) to a so-called request routing (RR) node of the CDN. The request routing node may locate the delivery node (e.g. a media server) on which the data of the requested base track is stored and send the URL of the localized delivery node in a redirect message back to the client (step 810).

The client may use the URL for sequentially requesting the temporal segments of the selected first spatial segment as identified in the SMF. Thus, after having received the redirect message, the client may send a request message back to the deliver node that is configured to deliver the base track to the client (step 812). In response, the delivery node may send the base track to the client (step 814). The data of the base track may be buffered and send the HEVC decoder, while the retrieval process for the temporal segments comprising the video data of the first spatial segment is continued by sending a request for the first temporal segment "full_panorma-left_1.MP4" of the first spatial segment to the network (step 816). The client may receive the first temporal segment in a response message (step 818) and start decoding and rendering the video on the basis of the information in the base track (step 820). This process may be repeated for subsequent temporal segments of the first spatial segment.

After a certain time, e.g. during the retrieval of the sixth temporal segment (steps 826 and 828), the client device may be triggered by the user navigation function switch to from a first spatial segment to a second spatial segment (step 830). For example, the user navigation function may detect a user interaction that is interpreted by the user navigation function as a panning action. The stream selector in the client device may parse the SMF and select a second spatial segment (step 832) defining the right sub-region of the full panorama, configure the decoder on the basis of the metadata in the SMF of the second spatial segment and start requesting temporal segments of the second spatial segment from the CDN (step 834) in a similar way as illustrated by steps 816-828).

Figure 9:
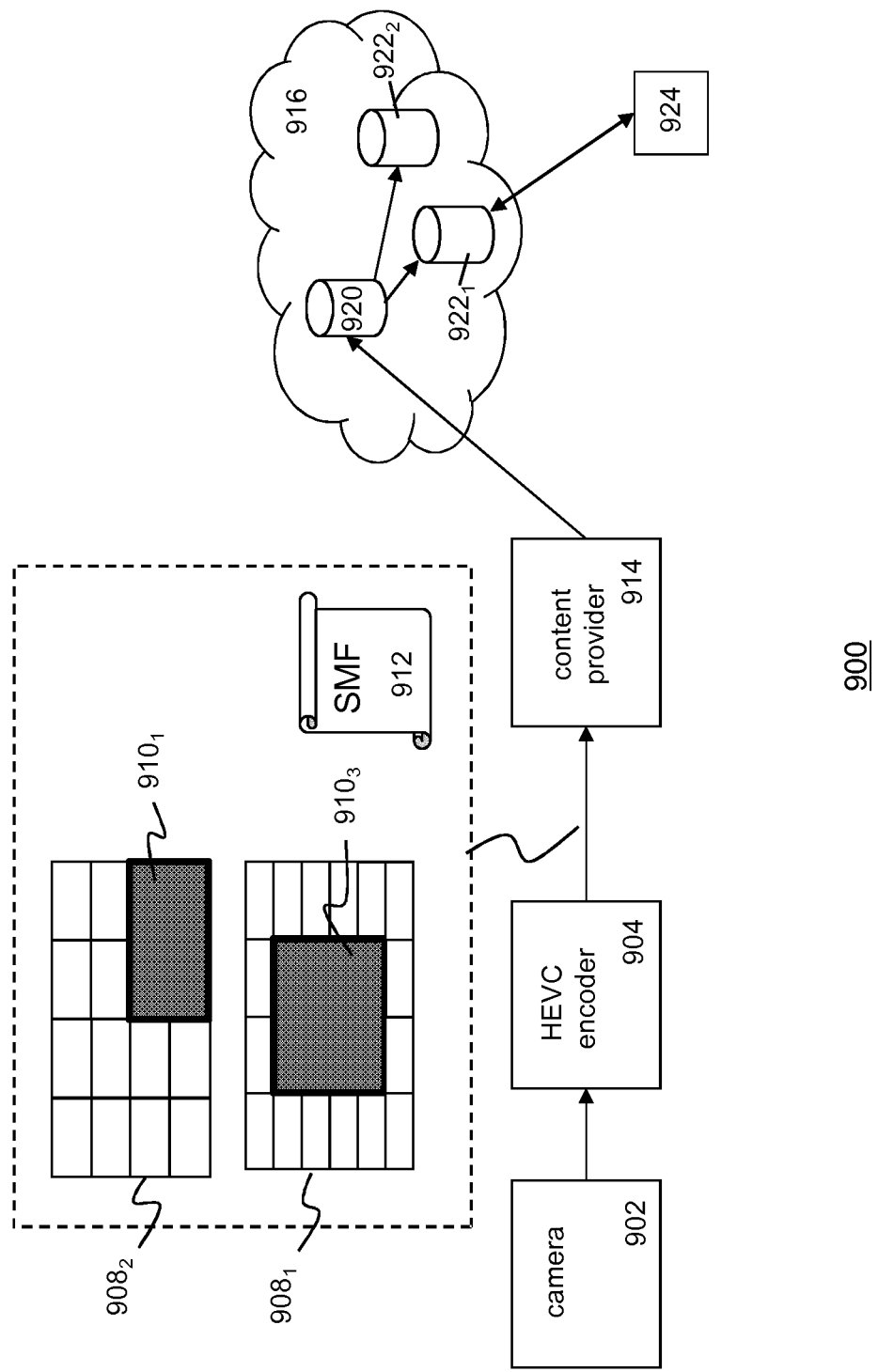
FIG. 9 depicts a schematic of a process for generating a HEVC-tiled stream of file comprising one or more spatial segments according to an embodiment of the invention.

FIG. 9 schematically depicts a process for generating HEVC-tiled video data according to an embodiment of the invention. In this example, one or more cameras 902, e.g. one or more high-resolution, wide field-of-view cameras may be used to generate or compose a source video. An HEVC encoder 904 may be used to generate one or more HEVC-tiled streams on the basis of a source video. The HEVC-tiled streams may define a Spatial Composition on the basis of the source video. The Spatial composition may comprise one or more Spatial Representations $908_{1,2}$. In an embodiment, a tile representation may relate to a panorama HEVC-tiled stream comprising a particular number of HEVC tiles per video frame. Further, for one or more Spatial Representations, one or more Spatial Segments $910_{1-3}$ may be generated wherein a spatial segment may relate to a HEVC-tiled stream comprising a subset of HEVC tiles of a HEVC-tiled video stream. During the encoding process, information (metadata) on the generated video data: identifiers and spatial and temporal information of a set of streams may be formatted in a SMF 912 as described with reference to FIGS. 4-6.

The thus generated one or more (HEVC-tiled) streams and SMFs may be stored at one or more delivery nodes $922_{1,2}$ in the network 916. A delivery node is configured to deliver a HEVC-tiled stream to a client device 924.

In an embodiment, a delivery node may be a media server. In another embodiment, at least part of the delivery nodes (sometimes also referred to as surrogate nodes) may be part of a dedicated content delivery network (CDN). In that case, HEVC-tiled streams may be ingested by a Content Delivery Network Control Function 920 (CDNCF) sometimes also referred to as a request routing node. The CDNCF may distribute the HEVC-tiled streams over different delivery nodes so that efficient distribution of the streams is ensured. In an embodiment, the CDN may update the tile (and segment) identifiers (the URLs) in the MPD such that a client device may efficiently access delivery nodes of the CDN in order to request the delivery of HEVC-tiled content.

When the client device 924 would like to access the video data, it may be provided with a SMF from a content provider or the CDN and use the SMF to request and playout HEVC-tiled video data. Here, the client device may generally relate to a (mobile) video data processing device such as an electronic tablet, a smart-phone, a notebook, a media player, a home gateway or DASH enabled devices such as a DASH-enabled HbbTV display device. Alternatively, the device may be a set-top box or content storage device configured for processing and temporarily storing content for future consumption by a content play-out device, which has access to the stored content.

The delivery of the video data to the client device may be based on any data transmission scheme. For example, a unicast scheme may be used to transmit data from a delivery node to the client. Alternatively, a broadcast or a multicast scheme (e.g. an IP multicast scheme) may be used to transmit the data to the client.

Figure 10:
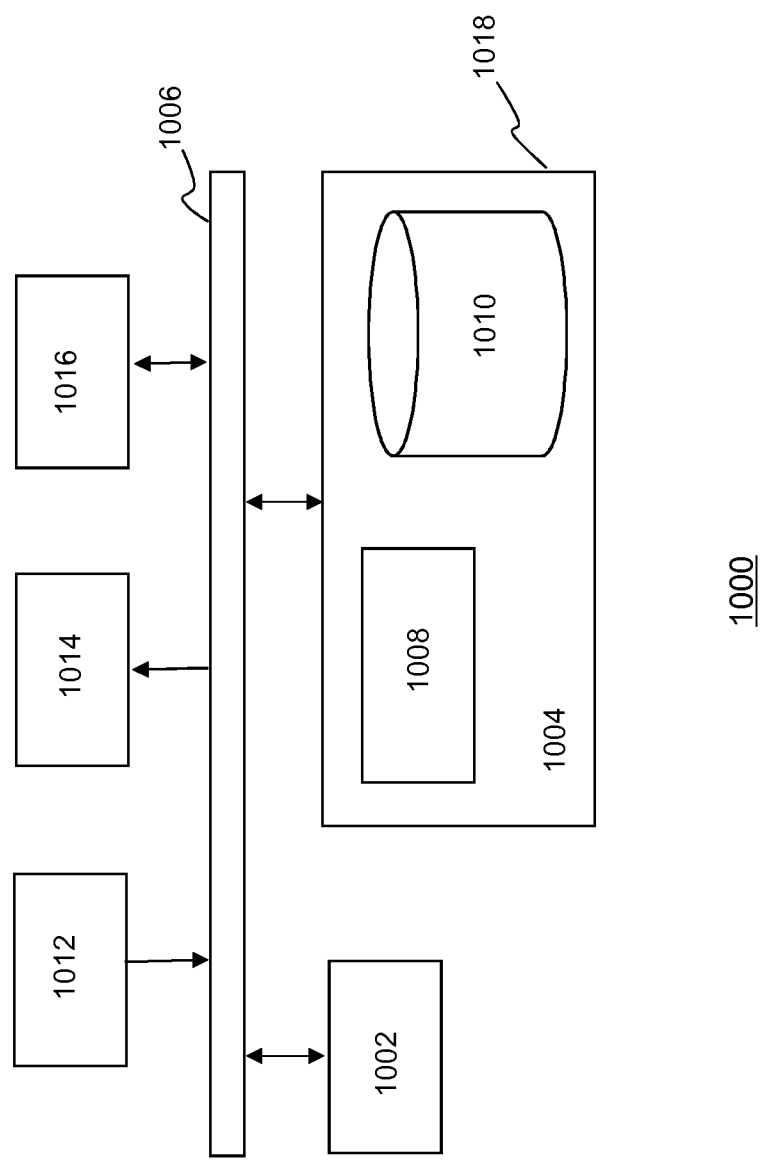
FIG. 10 is a block diagram illustrating an exemplary data processing system that may be used in systems and methods as described with reference to FIGS. 1-9.

FIG. 10 is a block diagram illustrating an exemplary data processing system that may be used in systems and methods as described with reference to FIGS. 1-9. Data processing system 1000 may include at least one processor 1002 coupled to memory elements 1004 through a system bus 1006. As such, the data processing system may store program code within memory elements 1004. Further, processor 1002 may execute the program code accessed from memory elements 1004 via system bus 1006. In one aspect, data processing system may be implemented as a computer that is suitable for storing and/or executing program code. It should be appreciated, however, that data processing system 1000 may be implemented in the form of any system including a processor and memory that is capable of performing the functions described within this specification.

Memory elements 1004 may include one or more physical memory devices such as, for example, local memory 1008 and one or more bulk storage devices 1010. Local memory may refer to random access memory or other non-persistent memory device(s) generally used during actual execution of the program code. A bulk storage device may be implemented as a hard drive or other persistent data storage device. The processing system 1000 may also include one or more cache memories (not shown) that provide temporary storage of at least some program code in order to reduce the number of times program code must be retrieved from bulk storage device 1010 during execution.

Input/output (I/O) devices depicted as input device 1012 and output device 1014 optionally can be coupled to the data processing system. Examples of input device may include, but are not limited to, for example, a keyboard, a pointing device such as a mouse, or the like. Examples of output device may include, but are not limited to, for example, a monitor or display, speakers, or the like. Input device and/or output device may be coupled to data processing system either directly or through intervening I/O controllers. A network adapter 1016 may also be coupled to data processing system to enable it to become coupled to other systems, computer systems, remote network devices, and/or remote storage devices through intervening private or public networks. The network adapter may comprise a data receiver for receiving data that is transmitted by said systems, devices and/or networks to said data and a data transmitter for transmitting data to said systems, devices and/or networks. Modems, cable modems, and Ethernet cards are examples of different types of network adapter that may be used with data processing system 1050.

As pictured in FIG. 10, memory elements 1004 may store an application 1018. It should be appreciated that data processing system 1000 may further execute an operating system (not shown) that can facilitate execution of the application. Application, being implemented in the form of executable program code, can be executed by data processing system 1100, e.g., by processor 1002. Responsive to executing application, data processing system may be configured to perform one or more operations to be described herein in further detail.

In one aspect, for example, data processing system 1000 may represent a client data processing system. In that case, application 1018 may represent a client application that, when executed, configures data processing system 1000 to perform the various functions described herein with reference to a "client", which is for the purpose of this application, sometimes also referred to as a "client device". Examples of a client aka client device may include, but are not limited to, a personal computer, a portable computer, a mobile phone, or the like.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of streaming HEVC-tiled video data to a client device comprising:
providing said client device with a spatial manifest file comprising one or more spatial segments identifiers for locating one or more delivery nodes configured for delivering video data associated with a spatial segment identified by at least one of said one or more spatial segments identifiers to said client device, said spatial segment being associated with HEVC-tiled video data comprising a subset, said subset comprising a plurality of HEVC tiles of a HEVC-tiled video stream having a tiled image area, wherein tiles of said subset each encompass a different area within said tiled image area, said spatial manifest file further comprising information for determining the position of said spatial segment within the tiled image area of said HEVC-tiled video stream; and,
selecting said at least one spatial segment identifier of said spatial manifest file for requesting a delivery node to deliver at least part of the video data of said spatial segment as a HEVC-tiled video stream to said client device, wherein video data of HEVC tiles in said spatial segment do not have spatial and/or temporal decoding dependency with video data of HEVC tiles in said HEVC-tiled video stream that are not part of the spatial segment,
said spatial manifest file further comprising metadata associated with said spatial segment, said metadata including information for determining whether the video data of a HEVC tile of said spatial segment have one or more spatial decoding dependencies on other HEVC tiles in said spatial segment.

2. The method according to claim 1 further comprising:
using said selected spatial segment identifier for sending a request to said delivery node for delivering video data associated with said spatial segment to said client device.

3. The method according to claim 2 wherein said request is a HTTP request.

4. The method according to claim 1 wherein said spatial segment is defined by segment boundaries that coincide with the HEVC tile boundaries in a row and column direction of said HEVC-tiled video stream, said segment boundaries enclosing a rectangular area comprising an integer number, being a plurality, of HEVC tiles, said number of HEVC tiles being smaller than the number of HEVC tiles in said HEVC-tiled video stream.

5. The method according to claim 1 wherein video data of at least part of said HEVC tiles in said spatial segment are decoded in parallel by a HEVC decoder.

6. The method according to claim 1 wherein said spatial manifest file further comprises one or more HEVC tile identifiers for locating one or more one or more delivery nodes configured for delivering video data associated with at least one HEVC tile of the subset of HEVC tiles of a spatial segment.

7. The method according to claim 1
wherein video data associated with a spatial segment are stored as a separate video track, said video data being accessible by said client device on the basis of spatial segment identifiers and/or HEVC tile identifiers.

8. The method according to claim 7 wherein said separate video track is an MPEG type file.

9. A computer program product comprising software code portions configured for, when run in the memory of a computer, executing the method steps according to claim 1.

10. A client device for processing HEVC-tiled video data, said client device being configured for:
parsing a spatial manifest file comprising one or more spatial segments identifiers for locating one or more delivery nodes configured for delivering video data associated with a spatial segment identified by at least one of said one or more spatial segments identifiers to said client device, said spatial segment being associated with HEVC-tiled video data comprising a subset, said subset comprising a plurality of HEVC tiles of a HEVC-tiled video stream having a tiled image area, wherein tiles of said subset each encompass a different area within said tiled image area; said spatial manifest file further comprising information for determining the position of said spatial segment within the tiled image area of said HEVC-tiled video stream; and
selecting said at least one spatial segment identifier in said spatial manifest file for requesting a delivery node to deliver at least part of the video data of said spatial segment as a HEVC-tiled video stream to the device; and using said selected spatial segment identifier for sending a request to said delivery node for delivering video data associated with said spatial segment to said device, wherein video data of HEVC toes in said spatial segment do not have spatial and/or temporal decoding dependency with video data of HEVC tiles in said HEVC-tiled video stream that are not part of the spatial segment,
said spatial manifest file further comprising metadata associated with said spatial segment, said metadata including information for determining whether the video data of a HEVC the of said spatial segment have one or more spatial decoding dependencies on other HEVC tiles in said spatial segment.

11. The client device according to claim 10 wherein said request is a HTTP request.

12. A non-transitory computer-readable storage medium comprising a stored data structure, being a spatial manifest file, said data structure comprising:
one or more spatial segments identifiers for locating one or more delivery nodes configured for delivering video data associated with a spatial segment identified by at least one of said one or more spatial segments identifiers to said client device, a spatial segment being associated with HEVC-tiled video data comprising a subset, said subset comprising a plurality of HEVC tiles of a HEVC-tiled video stream having a tiled image area, wherein tiles of said subset each encompass a different area within said tiled image area; said spatial manifest file further comprising information for determining the position of said spatial segment within the tiled image area of said HEVC-tiled video stream, wherein video data of HEVC tiles in said spatial segment do not have spatial and/or temporal decoding dependency with video data of HEVC tiles in said HEVC-tiled video stream that are not part of the spatial segment, said spatial manifest file further comprising metadata associated with said spatial segment, said metadata including information for determining whether the video data of a HEVC the of said spatial segment have one or more spatial decoding dependencies on other HEVC tiles in said spatial segment.

13. The non-transitory computer-readable storage medium according to claim 12 further comprising metadata associated with said selected spatial segment, said metadata including at least one of:
   information for determining that the selected spatial segment is related to HEVC-tiled video data;
   information for determining the number and/or size of HEVC-tiles in the selected spatial segment.

14. The non-transitory computer-readable storage medium according to claim 12 further comprising one or more HEVC title identifiers for locating one or more delivery nodes configured for delivering video data associated with at least one HEVC tile of the subset of HEVC tiles of said spatial segment.

* * * * *

UNITED STATES PATENT AND TRADEMARK OFFICE
CERTIFICATE OF CORRECTION

PATENT NO. : 10,694,192 B2
APPLICATION NO. : 15/318619
DATED : June 23, 2020
INVENTOR(S) : Emmanuel Thomas and Ray Van Brandenburg Page 1 of 1

It is certified that error appears in the above-identified patent and that said Letters Patent is hereby corrected as shown below:

In the Claims

In Claim 10, Column 22, Line 44, please delete "toes" and insert --tiles--.

In Claim 10, Column 22, Line 51, please delete "the" and insert --tile--.

In Claim 12, Column 23, Line 13, please delete "the" and insert --tile--.

Signed and Sealed this
Eighteenth Day of August, 2020

Andrei Iancu
*Director of the United States Patent and Trademark Office*